(12) United States Patent
Little et al.

(10) Patent No.: US 9,490,594 B2
(45) Date of Patent: *Nov. 8, 2016

(54) FLIPPABLE ELECTRICAL CONNECTOR

(71) Applicant: FOXCONN INTERCONNECT TECHNOLOGY LIMITED, Grand Cayman (KY)

(72) Inventors: Terrance F. Little, Fullerton, CA (US); Chih-Pi Cheng, New Taipei (TW); Chien-Ping Kao, Hummels town, PA (US); Wei-Hao Su, New Taipei (TW); An-Jen Yang, Irvine, CA (US); De-Cheng Zou, Monterey Park, CA (US); Chih-Hsien Chou, San Jose, CA (US)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 69 days.

This patent is subject to a terminal disclaimer.

(21) Appl. No.: 14/558,732

(22) Filed: Dec. 3, 2014

(65) Prior Publication Data

US 2015/0171574 A1     Jun. 18, 2015

Related U.S. Application Data

(63) Continuation-in-part of application No. 14/497,205, filed on Sep. 25, 2014, and a continuation-in-part of application No. 14/542,550, filed on Nov. 15, 2014, now Pat. No. 9,350,126, and a continuation-in-part of (Continued)

(51) Int. Cl.
*H01R 13/652* (2006.01)
*H01R 24/60* (2011.01)
(Continued)

(52) U.S. Cl.
CPC .......... *H01R 24/60* (2013.01); *H01R 13/6658* (2013.01); *H01R 12/724* (2013.01);
(Continued)

(58) Field of Classification Search
CPC .......... H01R 13/6591–13/6595; H01R 13/652
See application file for complete search history.

(56) References Cited

U.S. PATENT DOCUMENTS 3,587,029 A * 6/1971 Knowles ............ H01R 13/6471
  439/108
5,073,130 A    12/1991 Nakamura
(Continued)

FOREIGN PATENT DOCUMENTS

CM    CN201868687 U    6/2011
CN    201029143 Y    2/2008
(Continued)

OTHER PUBLICATIONS

Universal Serial Bus Type-C Cable and Connector Specification Revision 0.7 Working Draft Jan. xx, 2014, p. 13-14,20-21,33,38.

(Continued)

*Primary Examiner* — Gary Paumen
(74) *Attorney, Agent, or Firm* — Wei Te Chung; Ming Chieh Chang

(57) ABSTRACT

A receptacle connector mounted to a PCB, includes an insulative housing defining a mating tongue and a metallic shell enclosing the housing to form a mating cavity in which said mating tongue forwardly extends. A metallic shielding plate is embedded within a mid-level of the mating tongue wherein a leg of the shielding plate and a tail of an outermost grounding contact share the same conductive grounding region on the PCB. A plug connector mateable with the receptacle connector, includes an insulative housing defining a mating cavity to receive the mating tongue and equipped with a plurality of contacts and a metallic latch beside the mating cavity, wherein a tail of one grounding contact and a leg of the latch share the same conductive grounding region on a paddle card, which is behind the mating cavity and on which tails of the contacts are electrically and mechanically mounted.

20 Claims, 64 Drawing Sheets

Related U.S. Application Data application No. 14/477,889, filed on Sep. 5, 2014, and a continuation-in-part of application No. 14/454,737, filed on Aug. 8, 2014, and a continuation-in-part of application No. 14/337,180, filed on Jul. 21, 2014, now Pat. No. 9,318,853, said application No. 14/542,550 is a continuation-in-part of application No. 14/517,941, filed on Oct. 20, 2014.

(60) Provisional application No. 61/917,363, filed on Dec. 18, 2013, provisional application No. 61/926,270, filed on Jan. 11, 2014, provisional application No. 61/943,310, filed on Feb. 22, 2014, provisional application No. 61/949,232, filed on Mar. 6, 2014, provisional application No. 61/940,815, filed on Feb. 17, 2014, provisional application No. 61/916,147, filed on Dec. 14, 2013, provisional application No. 61/919,681, filed on Dec. 20, 2013, provisional application No. 61/875,096, filed on Sep. 8, 2013, provisional application No. 61/863,896, filed on Aug. 8, 2013, provisional application No. 61/866,037, filed on Aug. 14, 2013, provisional application No. 61/867,584, filed on Aug. 19, 2013, provisional application No. 61/856,077, filed on Jul. 19, 2013, provisional application No. 61/857,687, filed on Jul. 23, 2013, provisional application No. 61/899,276, filed on Nov. 3, 2013.

(51) Int. Cl.
*H01R 13/66* (2006.01)
*H01R 12/72* (2011.01)
*H01R 13/642* (2006.01)
*H01R 13/6582* (2011.01)
*H01R 24/28* (2011.01)
*H01R 107/00* (2006.01)
*H05K 1/11* (2006.01)
*H05K 1/18* (2006.01)

(52) U.S. Cl.
CPC ......... *H01R13/642* (2013.01); *H01R 13/6582* (2013.01); *H01R 24/28* (2013.01); *H01R 2107/00* (2013.01); *H05K 1/117* (2013.01); *H05K 1/184* (2013.01); *H05K 2201/09063* (2013.01); *H05K 2201/10189* (2013.01)

(56) References Cited

U.S. PATENT DOCUMENTS

| | | | | |
|---|---|---|---|---|
| 6,755,689 B2* | 6/2004 | Zhang | ............... | H01R 12/716 439/357 |
| 6,893,270 B2* | 5/2005 | Sercu | ............... | H01R 9/032 439/607.41 |
| 7,175,465 B1* | 2/2007 | Tsai | ............... | H01R 13/6275 439/352 |
| 7,758,379 B2* | 7/2010 | Chen | ............... | H01R 13/6485 439/607.11 |
| 8,087,944 B2* | 1/2012 | Kumamoto | ............... | H01R 12/716 439/108 |
| 8,419,473 B1* | 4/2013 | Lan | ............... | H01R 13/405 439/607.17 |
| 8,517,773 B2* | 8/2013 | Lee | ............... | H01R 12/722 439/660 |
| 8,968,031 B2* | 3/2015 | Simmel | ............... | H01R 13/659 439/108 |
| 2005/0181670 A1* | 8/2005 | Kumamoto | ............... | H01R 13/6275 439/358 |
| 2006/0121783 A1* | 6/2006 | Wu | ............... | H01R 9/032 439/607.41 |
| 2008/0003881 A1* | 1/2008 | Wu | ............... | H01R 13/5808 439/607.41 |
| 2009/0156027 A1 | 6/2009 | Chen | | |
| 2010/0267261 A1 | 10/2010 | Lin | | |
| 2013/0095702 A1* | 4/2013 | Golko | ............... | H01R 13/6273 439/676 |
| 2014/0024257 A1 | 1/2014 | Castillo et al. | | |
| 2014/0187086 A1* | 7/2014 | Little | ............... | H01R 13/6585 439/607.34 |
| 2015/0056839 A1 | 2/2015 | Zhang | | |
| 2015/0162684 A1* | 6/2015 | Amini | ............... | H01R 12/73 439/660 |
| 2015/0171562 A1 | 6/2015 | Gao et al. | | |
| 2015/0171573 A1* | 6/2015 | Little | ............... | H01R 24/60 439/607.34 |
| 2015/0171574 A1* | 6/2015 | Little | ............... | H01R 24/60 439/78 |
| 2015/0214673 A1* | 7/2015 | Gao | ............... | H01R 13/6597 439/352 |
| 2015/0214674 A1* | 7/2015 | Simmel | ............... | H01R 13/659 439/607.35 |
| 2015/0295362 A1* | 10/2015 | Tziviskos | ............... | H01R 13/6581 439/607.01 |
| 2015/0340813 A1* | 11/2015 | Ng | ............... | H01R 13/646 439/607.28 |
| 2015/0340815 A1* | 11/2015 | Gao | ............... | H01R 13/6581 439/607.01 |
| 2015/0340825 A1* | 11/2015 | Ng | ............... | H01R 24/70 439/607.28 |
| 2016/0118752 A1 | 4/2016 | Guo et al. | | |

FOREIGN PATENT DOCUMENTS

| | | |
|---|---|---|
| CN | 201230066 Y | 4/2009 |
| CN | 101573840 A | 11/2009 |
| CN | 201623280 U | 11/2010 |
| CN | 201741935 U | 2/2011 |
| CN | 201741937 U | 2/2011 |
| CN | 102437482 A | 5/2012 |
| CN | 102544812 A | 7/2012 |
| CN | 202423735 | 9/2012 |
| CN | 202737282 | 2/2013 |
| CN | 103081253 A | 5/2013 |
| CN | 203242848 U | 10/2013 |
| CN | 203481540 U | 3/2014 |
| TW | M288035 | 2/2006 |
| TW | M357077 | 5/2009 |
| TW | M391213 | 10/2010 |
| TW | I427870 | 6/2011 |
| TW | M414692 | 10/2011 |
| TW | M443957 | 12/2012 |
| TW | M453995 | 5/2013 |
| TW | M454654 | 6/2013 |
| TW | M471688 | 2/2014 |
| WO | WO2009147791 | 12/2009 |
| WO | WO2013/020359 | 2/2013 |

OTHER PUBLICATIONS

USB Type-C Specification 0.9c05—May 18, 2014, p. 24-44,47,53-64,84-86.
Universal Serial Bus Type-C Cable and Connector Specification Revision 1.0 Aug. 11, 2014, p. 18-19,28-48,51,55,58,59-63,65-67,70,93,96-99.

* cited by examiner

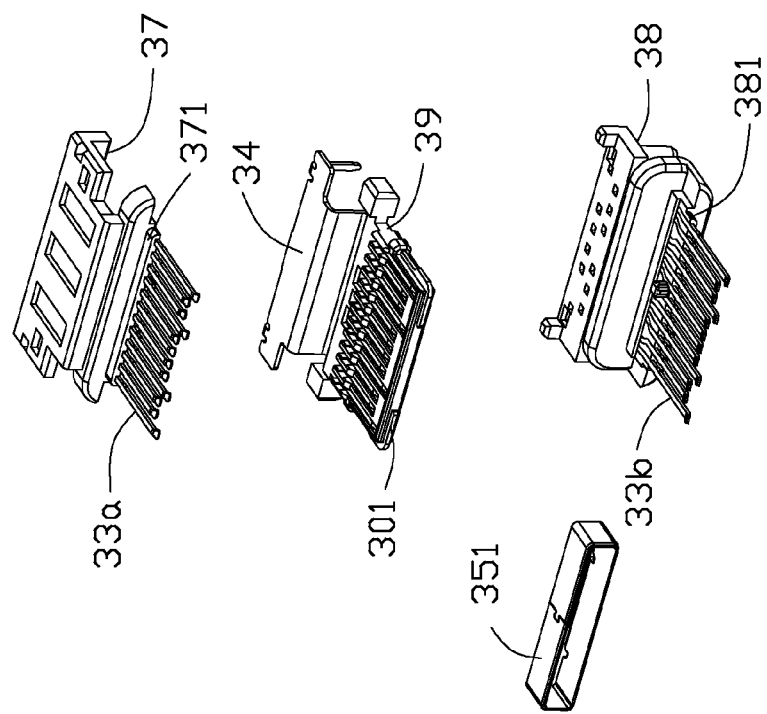
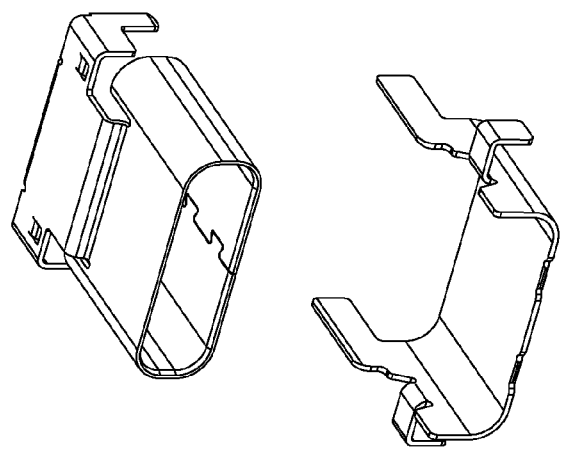
FIG. 20(A)

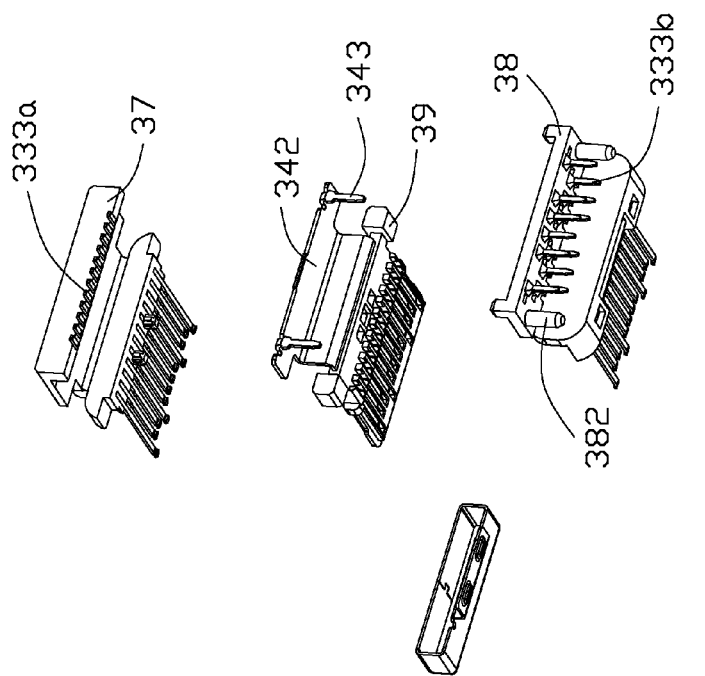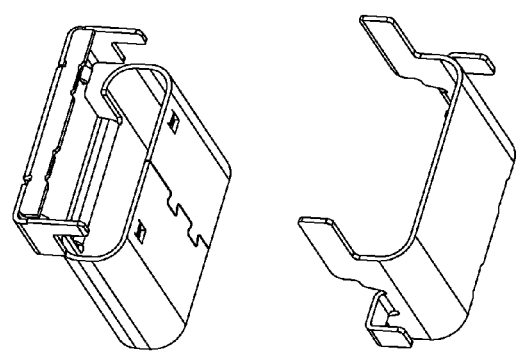
FIG. 20(B)

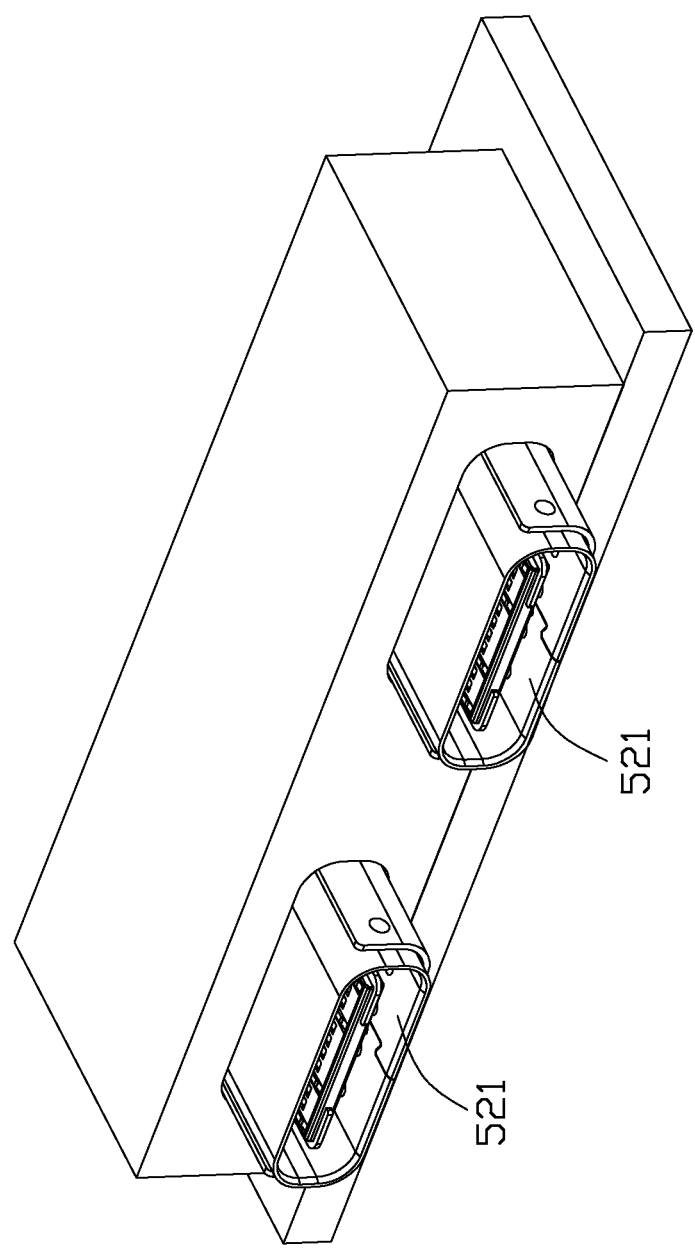

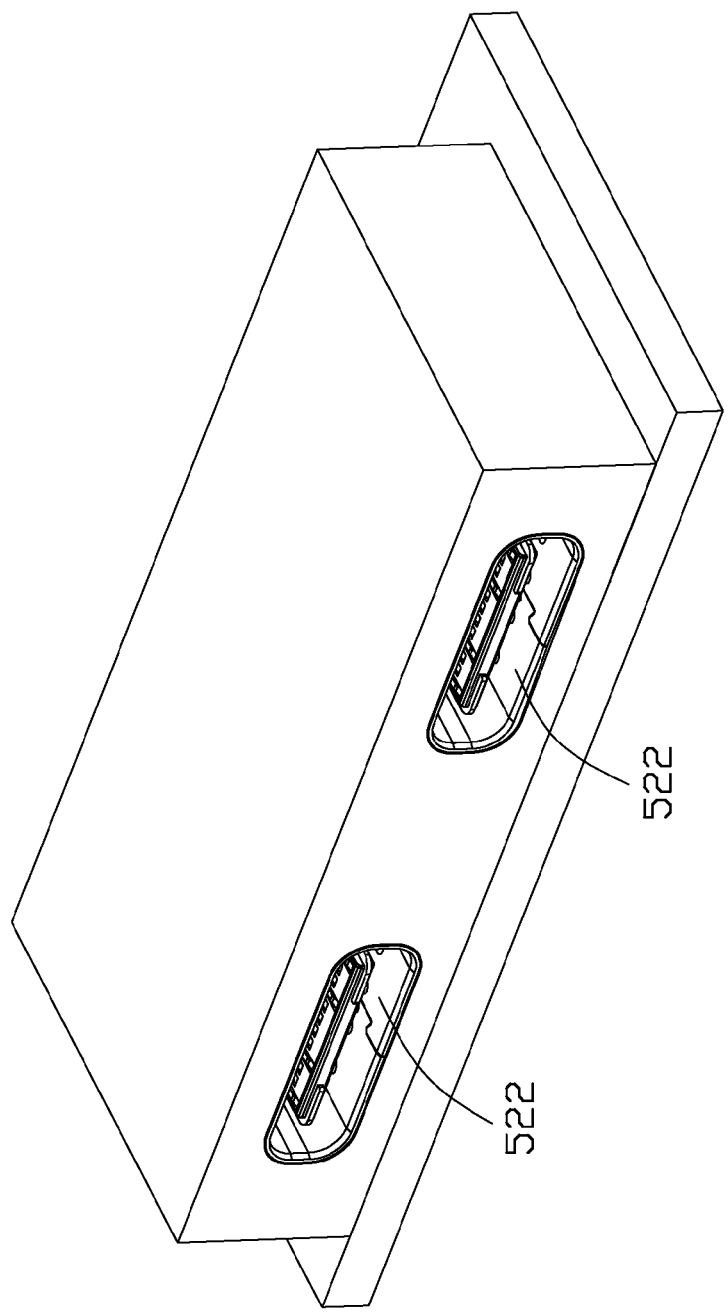

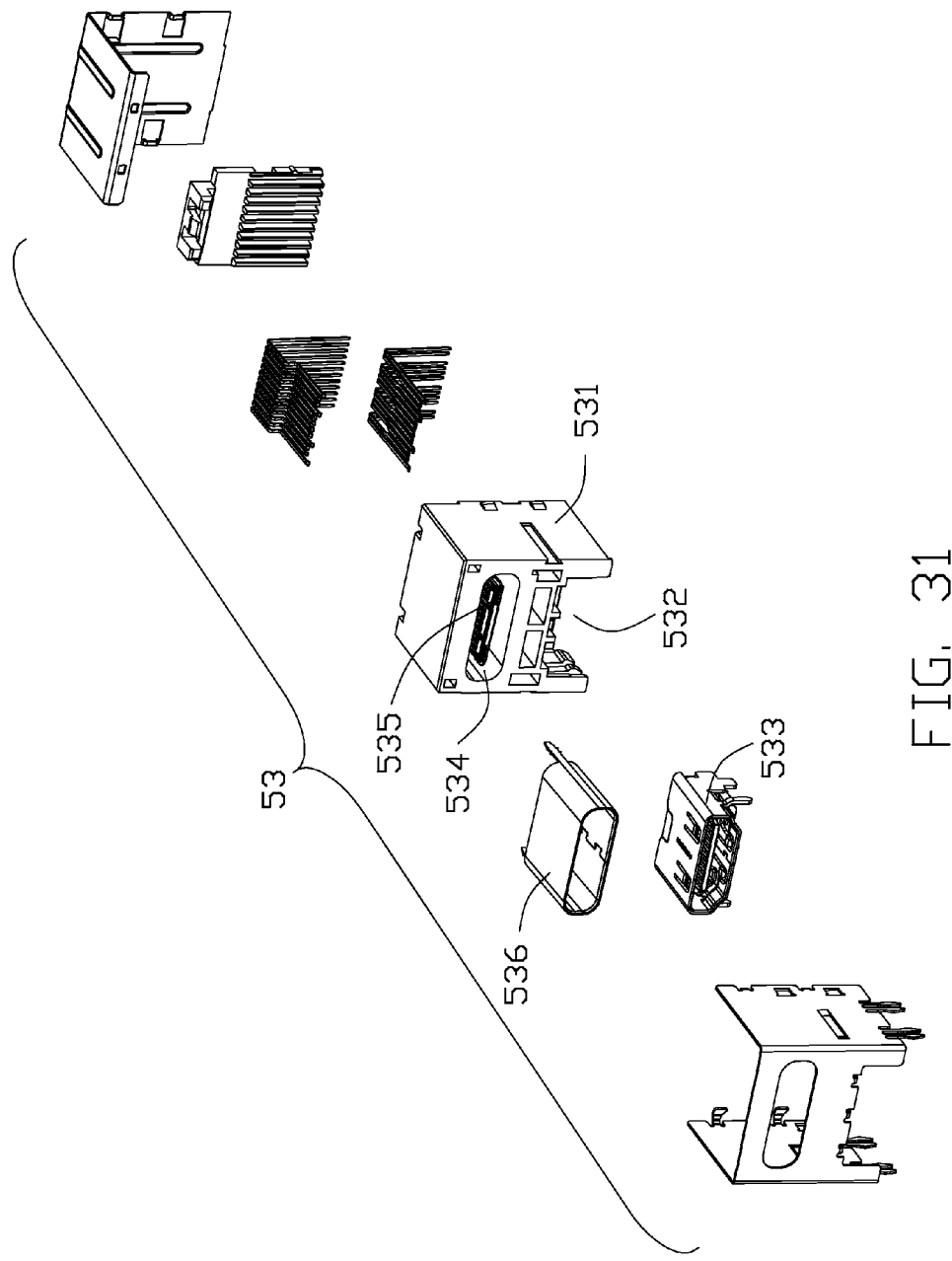

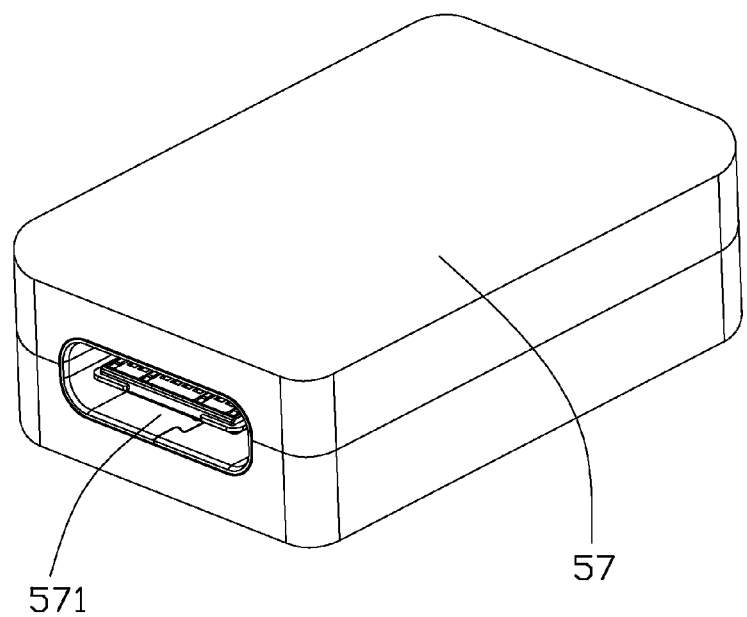
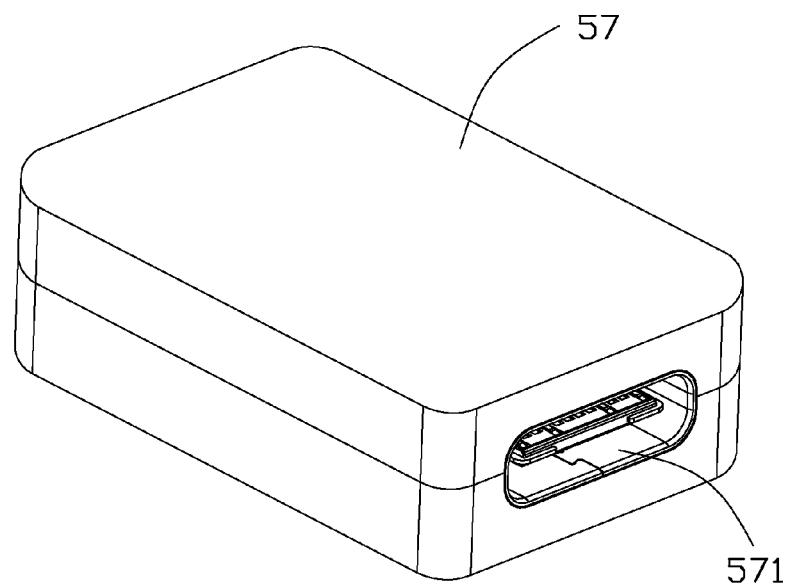
FIG. 34(B)

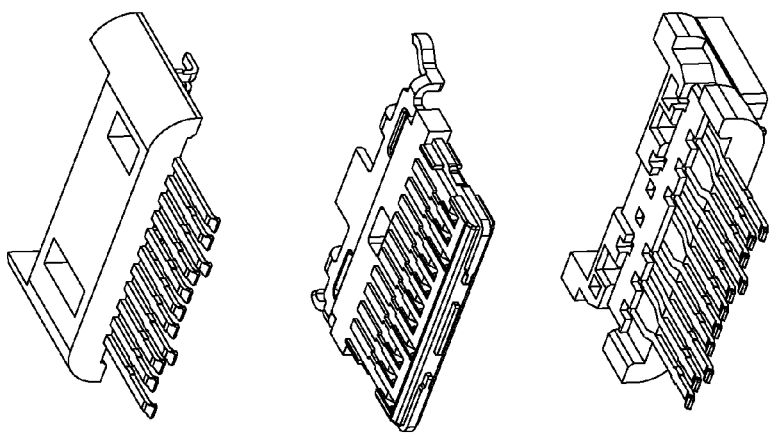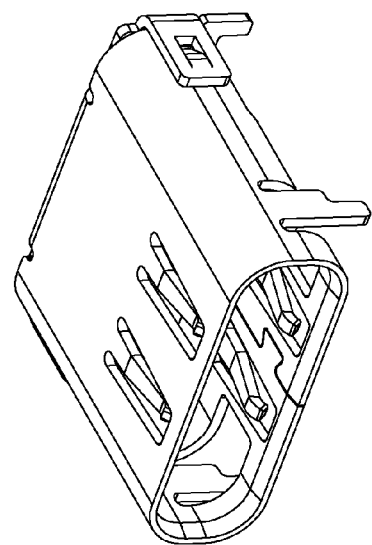
FIG. 48

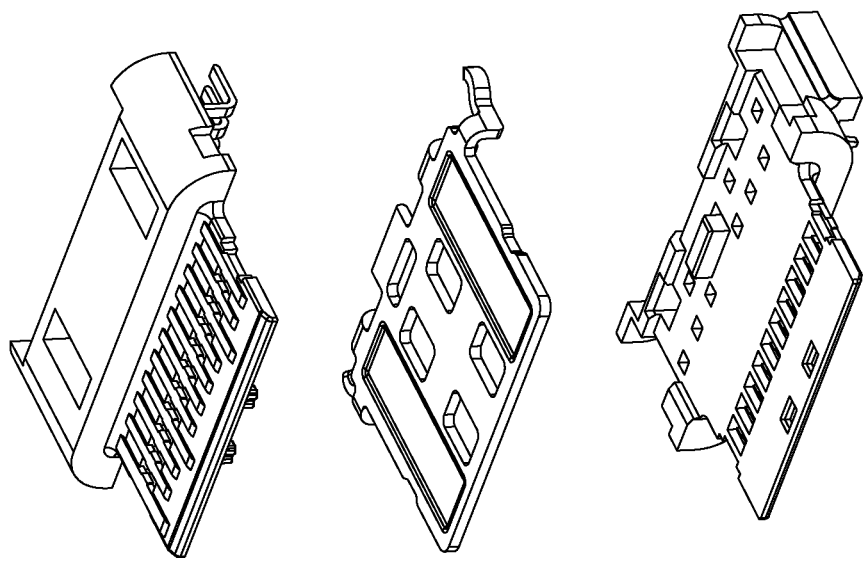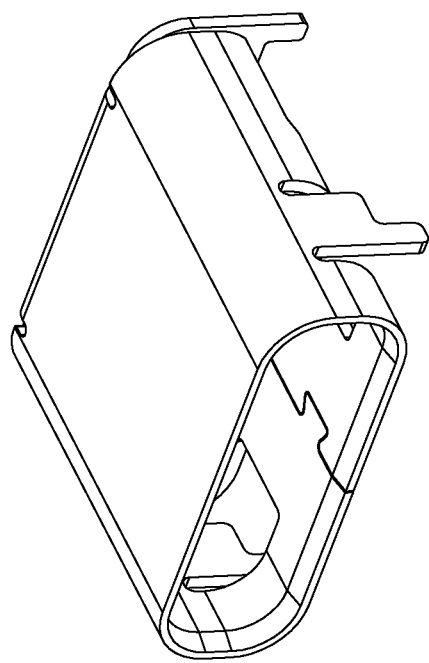
FIG. 53

FLIPPABLE ELECTRICAL CONNECTOR

CROSS REFERENCE TO RELATED APPLICATIONS

This application is a continuation-in-part of the co-pending application Ser. No. 14/497,205 filed Sep. 25, 2014, a continuation-in-part of the copending application Ser. No. 14/542,550 filed (Nov. 15, 2014), and the instant application further claims the benefit of, and priority to, U.S. Provisional Patent Application No. 61/940,815, filed Feb. 17, 2014, No. 61/943,310, filed Feb. 22, 2014, No. 61/949,232, filed Mar. 6, 2014, No. 61/917,363 filed Dec. 18, 2013, No. 61/926,270 filed Jan. 11, 2014, the contents of which are incorporated entirely herein by reference.

BACKGROUND OF THE INVENTION

1. Field of the Invention

The present invention relates to an electrical connector, and more particularly to a flippable plug connector used with a receptacle connector.

2. Description of Related Art

In the previously filed provisional applications, the plug connector is "flippable" whereas we turn the plug over and it functions the same top and bottom. In order to be able to handle switching of the super speed signaling, a MUX (or SS switch) is built into the silicon. This can be costly and also cause some additional degredation in the super speed signals.

Hence, a new and simple electrical plug connector and the complementary receptacle connector are desired.

SUMMARY OF THE INVENTION

Accordingly, the object of the present invention is to provide a receptacle connector mounting upon a printed circuit board and adapted for mating with a plug connector. The receptacle connector comprises an insulative housing defining base with a mating tongue forwardly extending therefrom; a plurality of contacts disposed in the housing with contacting sections exposed upon the mating tongue and categorized with signal contacts, power contacts and grounding contacts; a metallic shell enclosing the housing to define a mating cavity in which mating tongue is disposed; and a metallic shielding plate disposed within a middle level of the mating tongue; wherein the shielding plates defines a pair of lateral edge sections configured to be adapted to be locked with a latch of the plug connector.

Other objects, advantages and novel features of the invention will become more apparent from the following detailed description when taken in conjunction with the accompanying drawings.

BRIEF DESCRIPTION OF THE DRAWINGS

FIG. 20(A) is a front partially exploded perspective view of the receptacle connector of FIG. 13 wherein the housing and the contacts are pre-assembled together.

FIG. 20(B) is a rear partially exploded perspective view of the receptacle connector of FIG. 13 wherein the housing and the contacts are pre-assembled together.

FIG. 30(A) shows a dual port connector assembly having one unitary housing equipped with a pair of side by side receptacle connector units in the transverse direction wherein the mating cavities of the pair of receptacle connector units are spaced from while facing each other in the transverse direction according to the invention.

FIG. 30(B) shows a dual port connector assembly having one unitary housing equipped with a pair of side by side receptacle connector units in the transverse direction wherein the mating cavities of the pair of receptacle connector units are spaced from while isolated from each other in the transverse direction by the partition of the housing according to the invention.

FIG. 31 shows a dual port connector assembly having one upstanding housing frame equipped with a pair of receptacle connector units in the vertical direction wherein the lower port is performed by an independent receptacle connector received in a reserved space at a lower level while the upper port is provided by the housing frame at the upper level according to the invention.

FIG. 34(B) shows an adaptor connector assembly according to the invention wherein both two opposite ports are of the receptacle type interface while electrically connected vi an internal printed circuit board.

FIG. 48 is an exploded perspective view of the corresponding receptacle connector in FIG. 47;

FIG. 53 is an exploded perspective view of the terminal module assembly of FIG. 52 and the metallic shield adapted to enclose thereon to form the receptacle connector.

DETAILED DESCRIPTION OF THE PREFERRED EMBODIMENT

Figure 1:
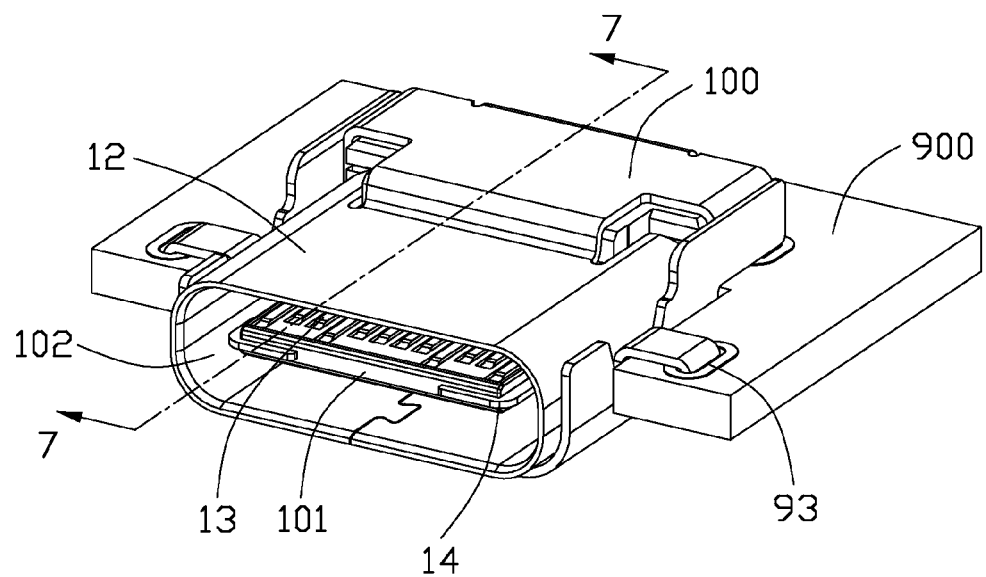
FIG. 1 is a perspective view of a receptacle connector of a first embodiment of the instant invention, which is mounted upon a printed circuit board in a sink manner.
Figure 2:
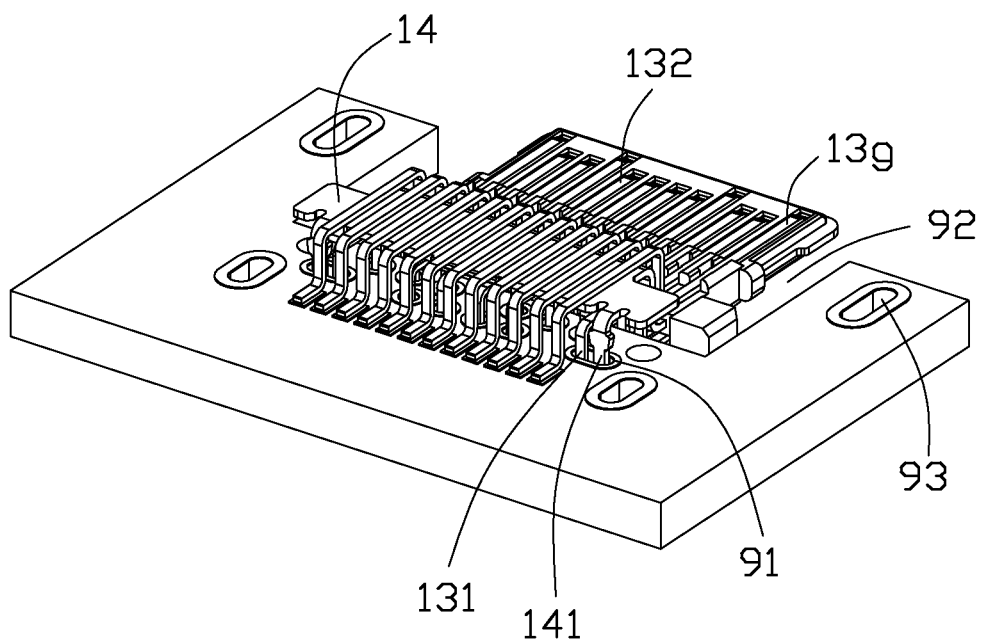
FIG. 2 is a perspective view of the partial receptacle connector and the printed circuit board to show how the leg of the shielding plate and the leg of one grounding contact sharing the same oval shaped via.
Figure 3:
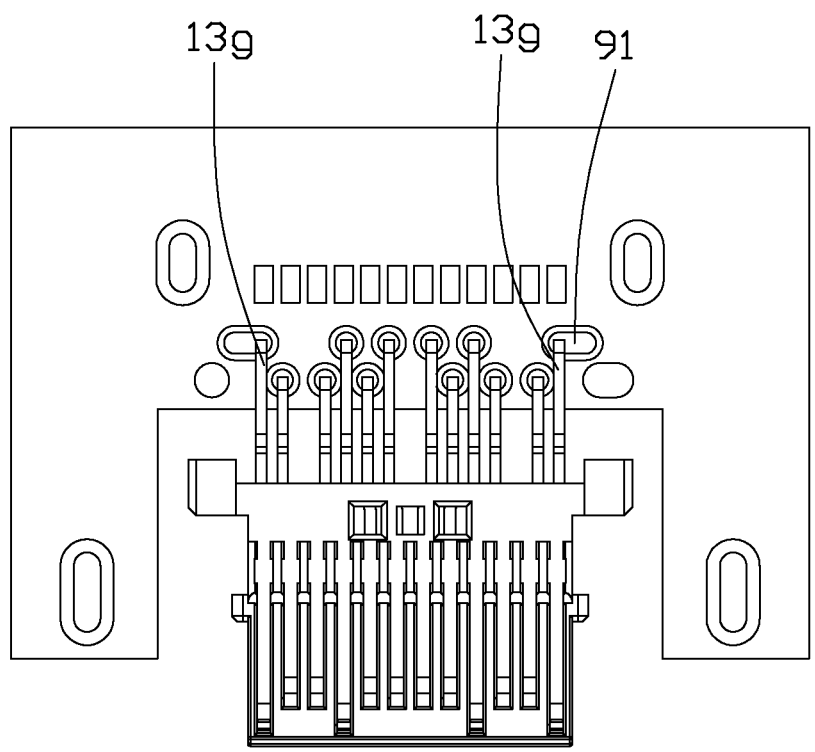
FIG. 3 is a top view of the partial receptacle connector and the printed circuit board of FIG. 2 wherein upper contacts and the shielding plate are taken away.
Figure 4:
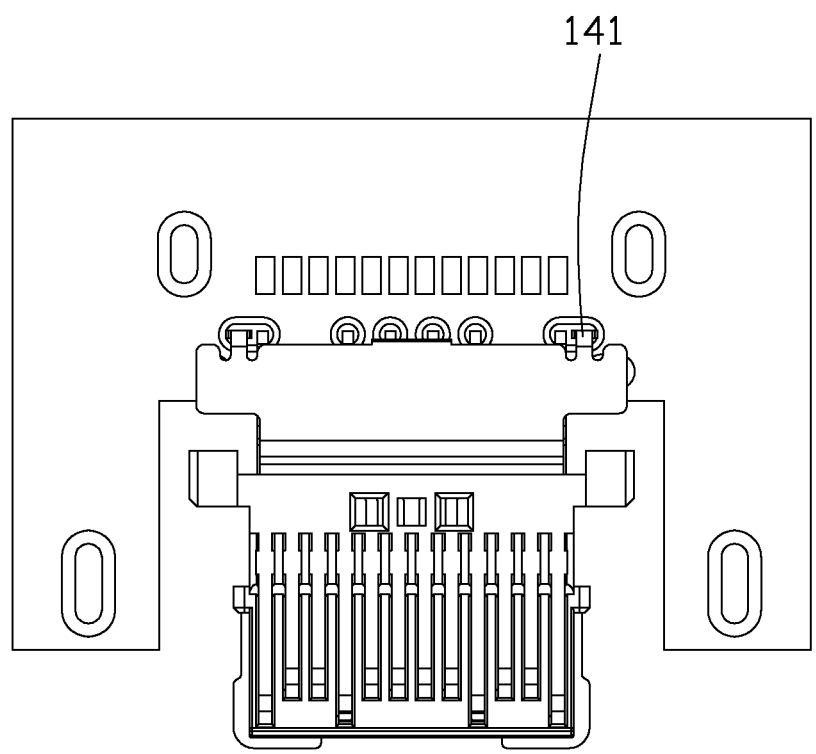
FIG. 4 is a top view of the partial receptacle connector and the printed circuit board of FIG. 2 wherein the upper contacts are taken away.
Figure 5A:
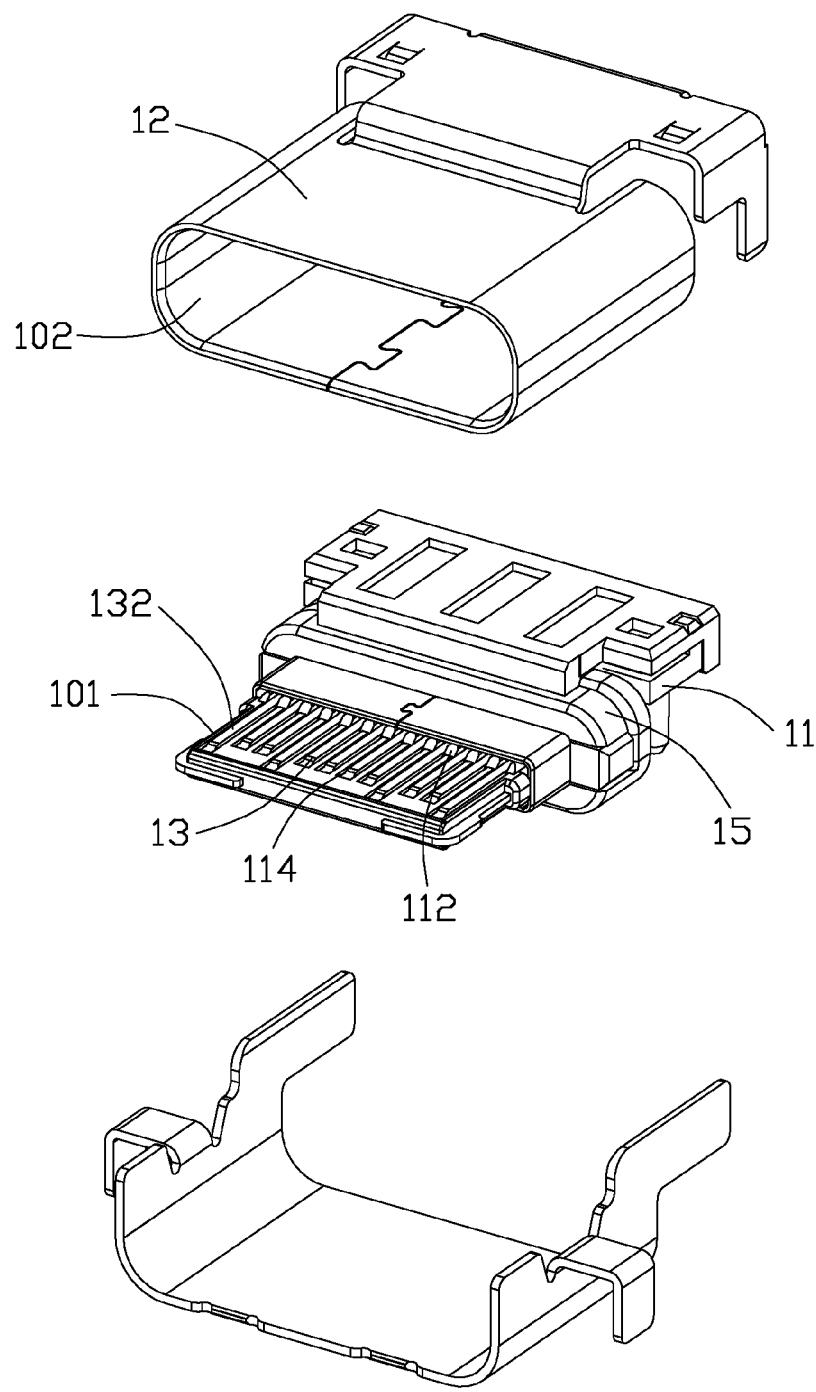
FIG. 5(A) is a front and toppartially exploded perspective view of the receptacle connector of FIG. 1.
Figure 5B:
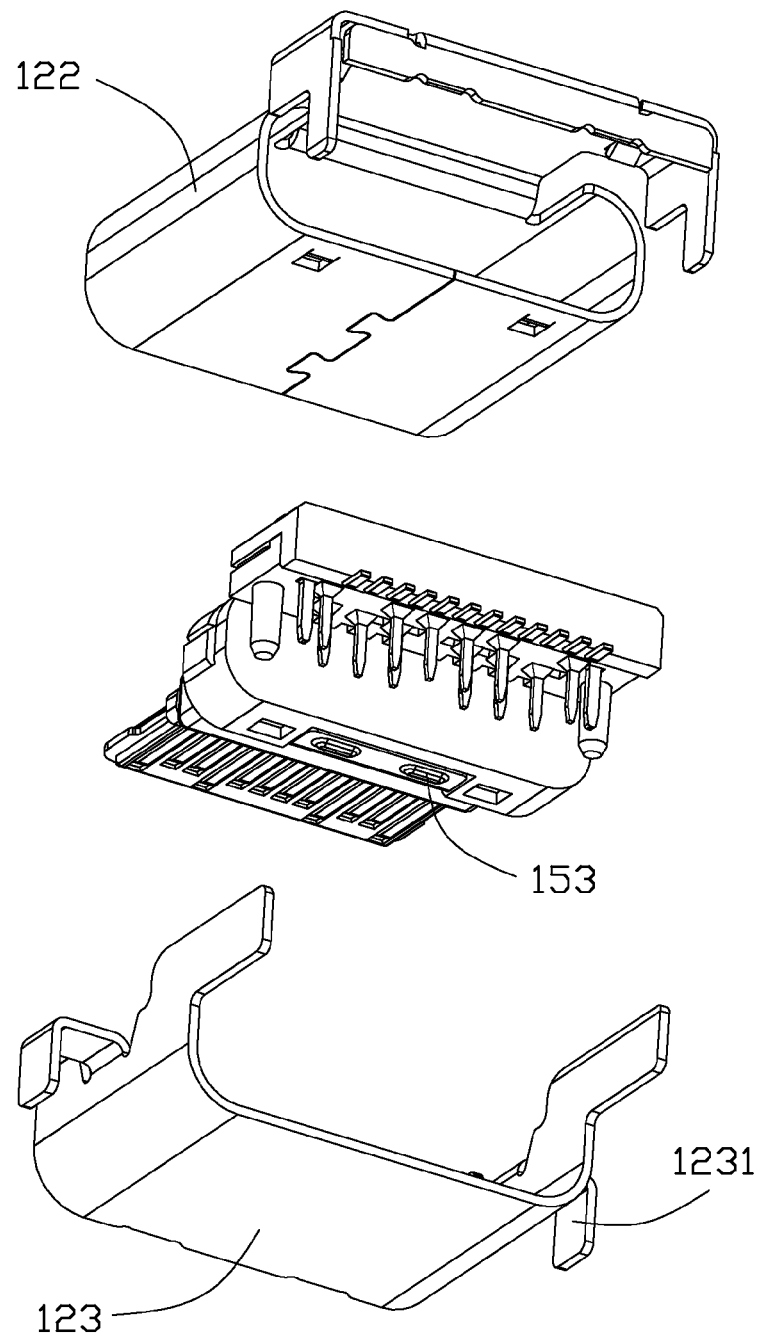
FIG. 5(B) is a rear and bottom partially exploded perspective view of the receptacle connector of FIG. 1.
Figure 6:
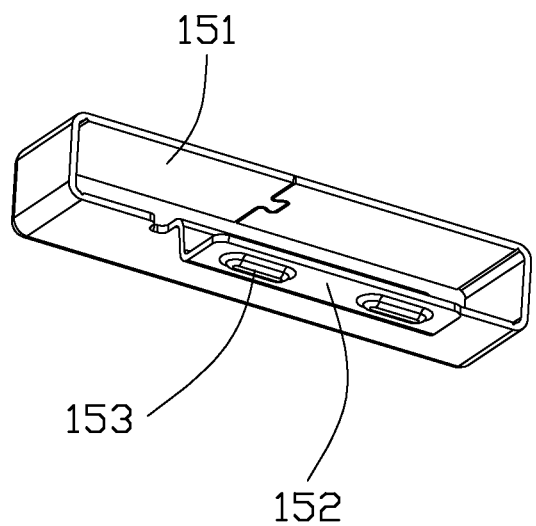
FIG. 6 is an enlarged perspective view of the metallic EMI collar of the receptacle connector.

Reference will now be made in detail to the preferred embodiment of the present invention.

FIGS. 1-12 show a first embodiment of a receptacle connector 100 mounted upon a printed circuit board 900 in a sink manner and a plug connector 200. As shown in FIGS.

1-7, the receptacle connector 100 includes an insulative housing with a mating tongue 101 enclosed in a metallic shell or EMI bracelet 12. A plurality of contacts 13 are disposed in the housing with contacting sections 132 exposed upon two opposite surfaces of the mating tongue 101. Understandably, the contacts 13 include the signal contacts, the grounding contacts and the power contacts thereof. A metallic shielding plate 14 is located at a middle level within the mating tongue 101 with edge portions extending out of the edges of the mating tongue for protection and locking consideration. The leg 141 of the shielding plate 14 and the tail 131 of the outmost grounding contact 13g extend into a same oval shaped via 91 of the printed circuit board 900. This common termination arrangement may achieve good signal transmission performance. Understandably, because the receptacle connector 100 is mounted in a notch 92 of the printed circuit board 900 in a sink manner in this embodiment, the tails 131 of the contacts 13 and the shielding plate 14 form the U-shaped structure for compliantly mounted to the printed circuit board 900.

Figure 7:
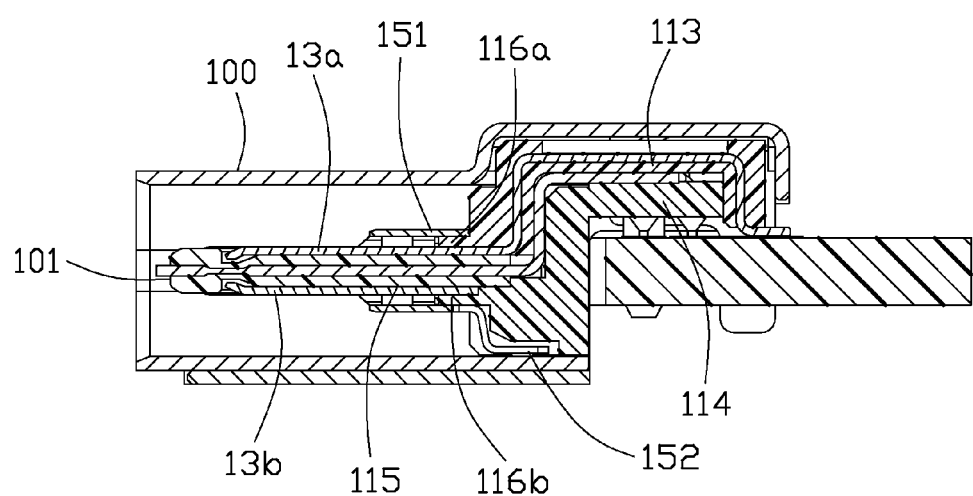
FIG. 7 is a cross-sectional view of the receptacle connector taken along lines 7-7 in FIG. 1.
Figure 8:
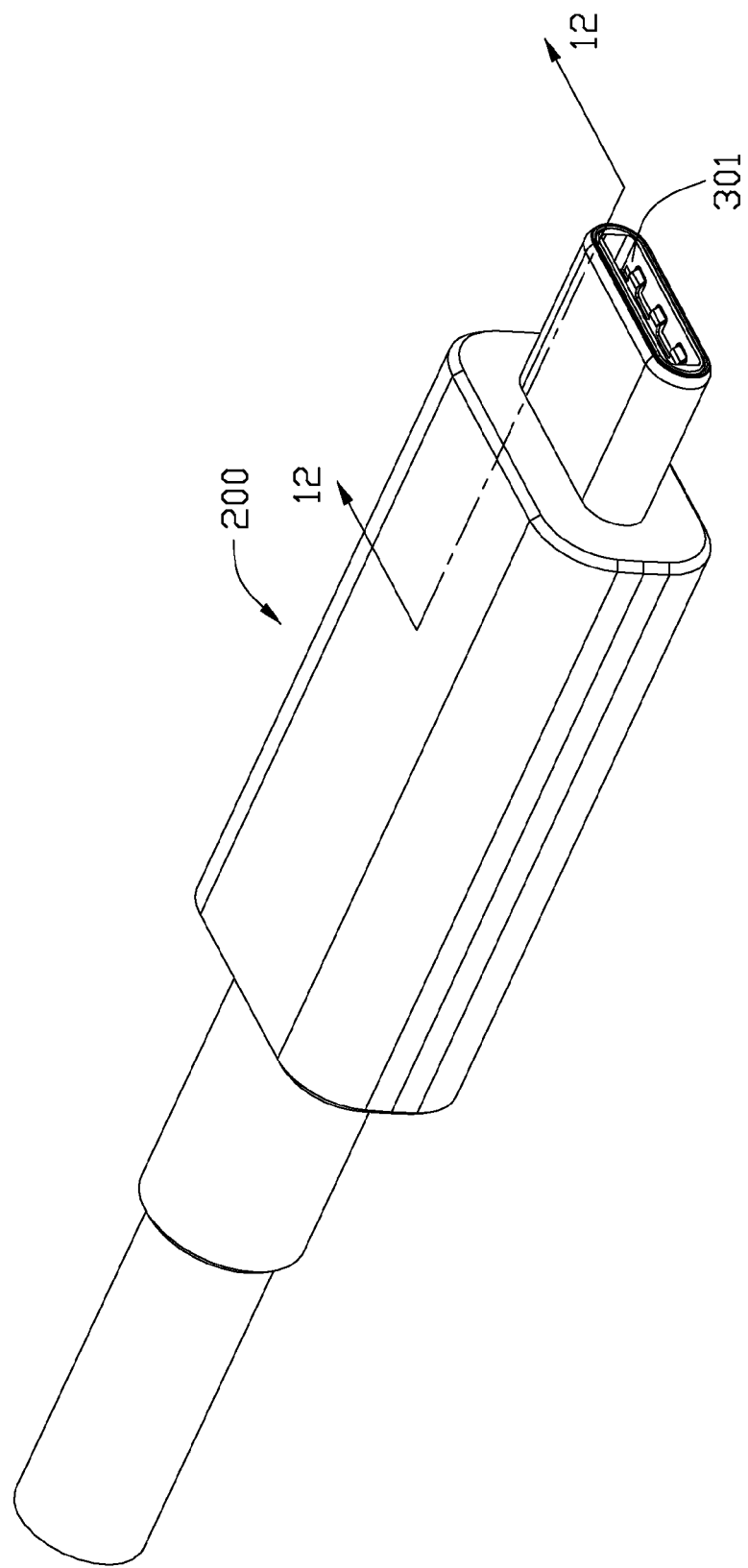
FIG. 8 is a perspective view of the plug connector of the first embodiment of the instant invention.
Figure 9:
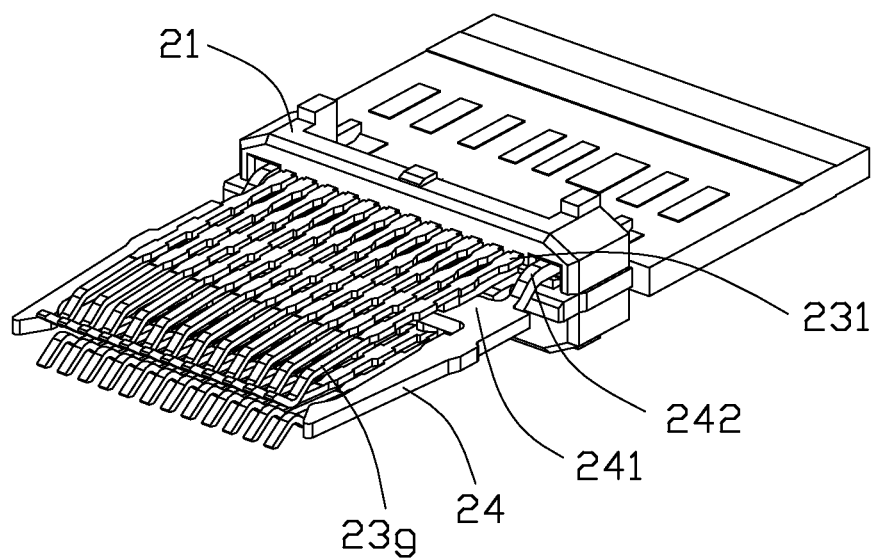
FIG. 9 is an enlarged perspective views of the partial plug connector of FIG. 8 to show the leg of the latch and the tail of the grounding contact share the same grounding pad on the paddle card.
Figure 10:
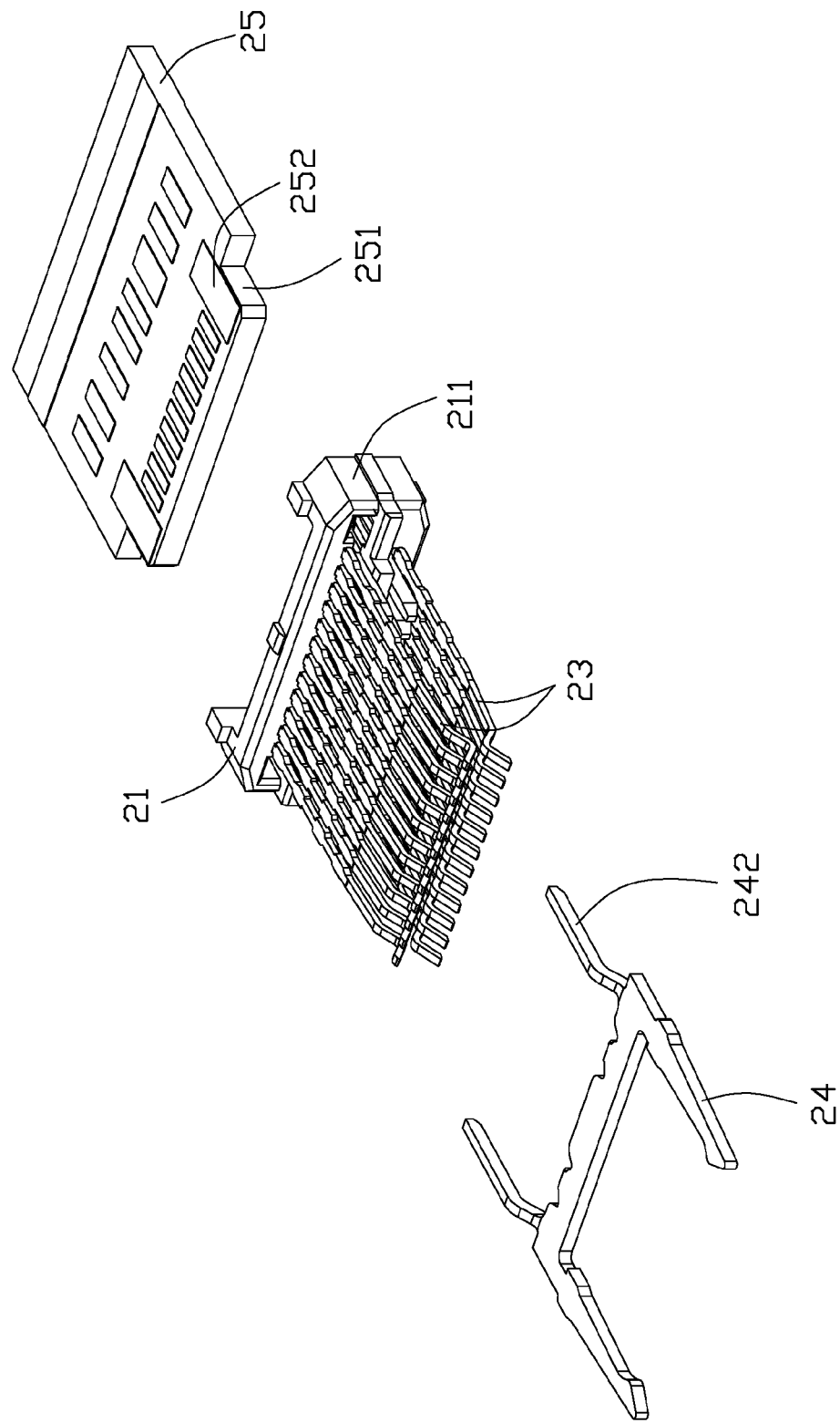
FIG. 10 is an exploded perspective views of the partial plug connector of FIG. 9.
Figure 12:
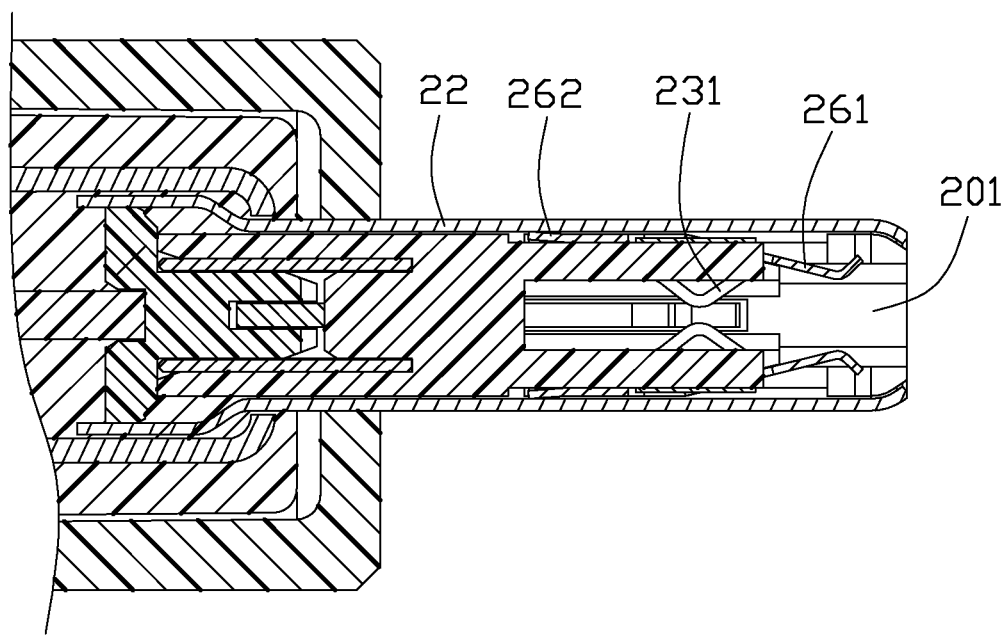
FIG. 12 is an enlarged cross-sectional view of the plug connector taken along lines 12-12 in FIG. 8.
Figure 13:
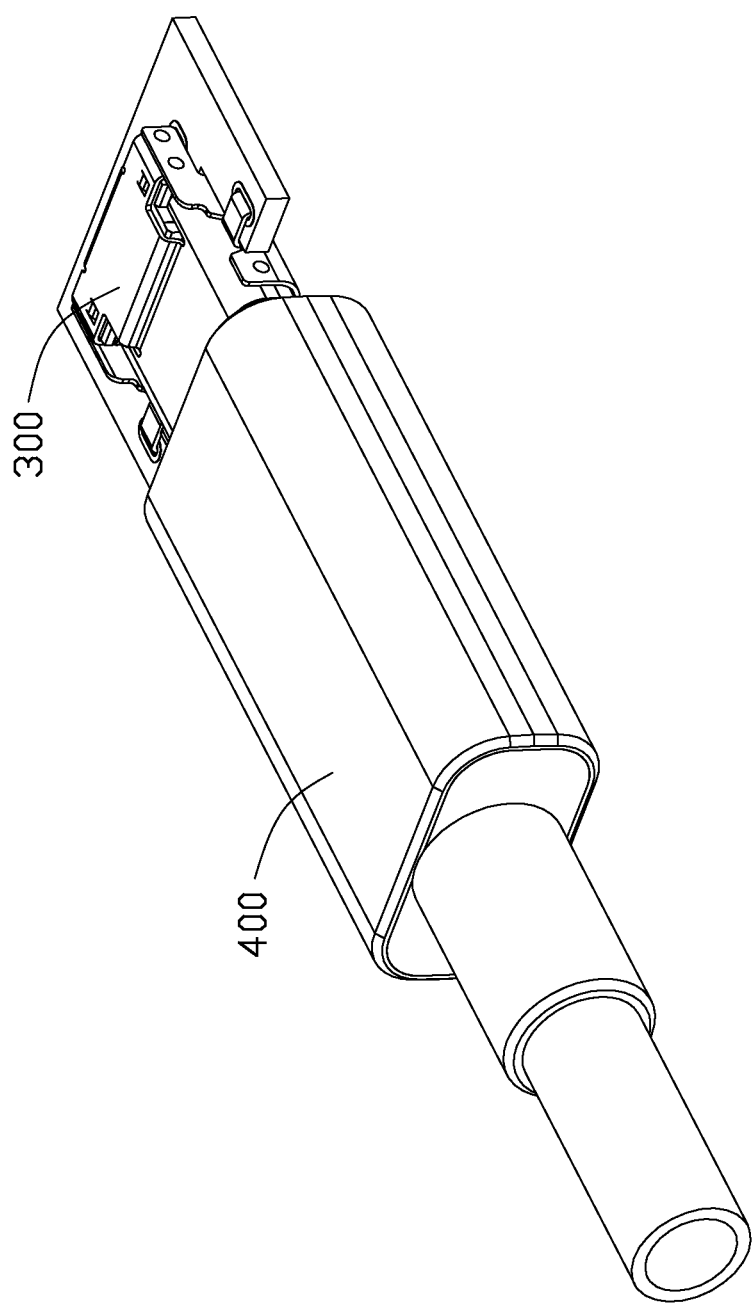
FIG. 13 is an assembled perspective view of the mated receptacle connector on the printed circuit board and the plug connector of a second embodiment of the instant invention.
Figure 14:
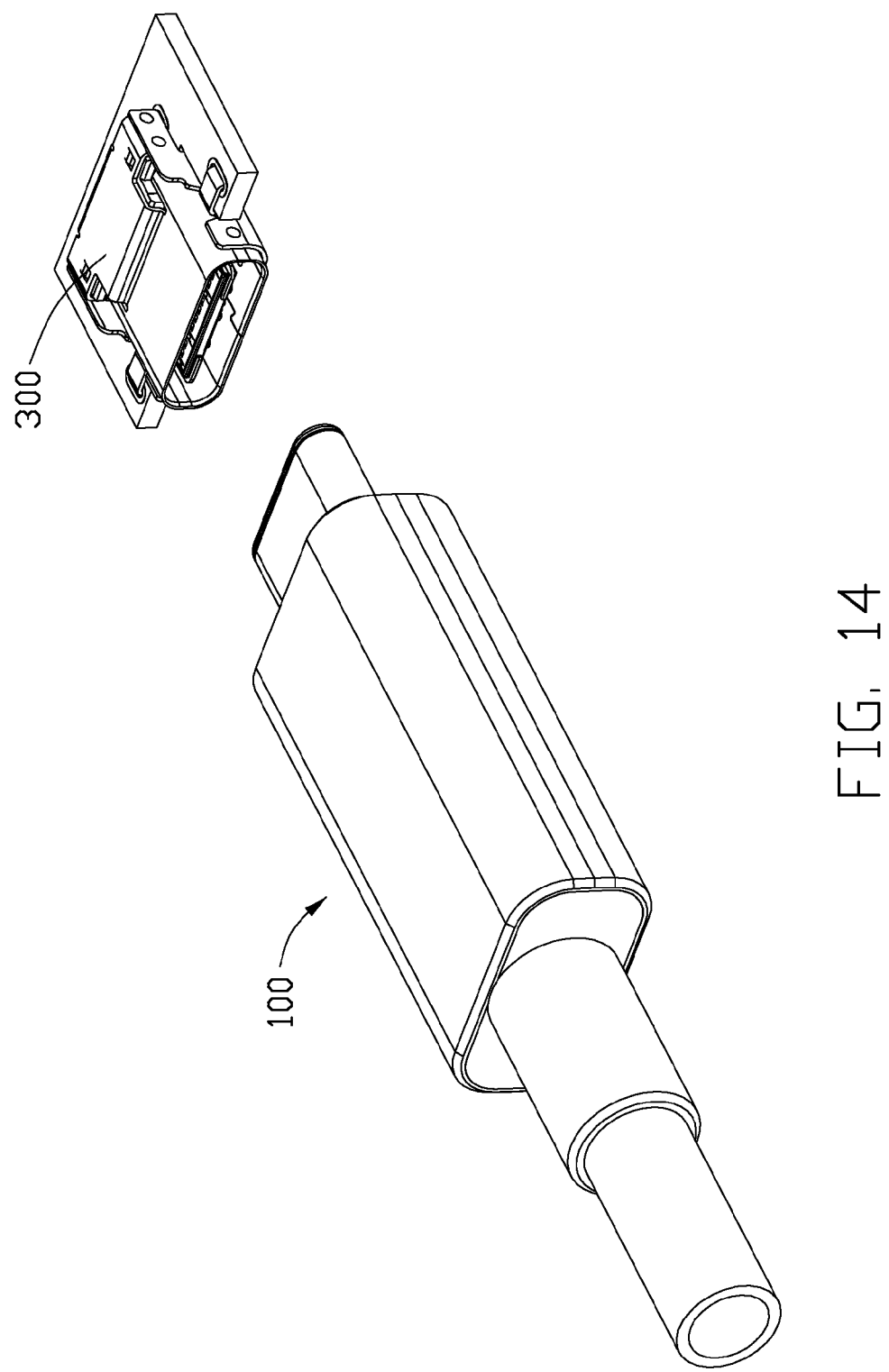
FIG. 14 is a front exploded perspective view of the receptacle connector and the plug connector of FIG. 13.
Figure 15:
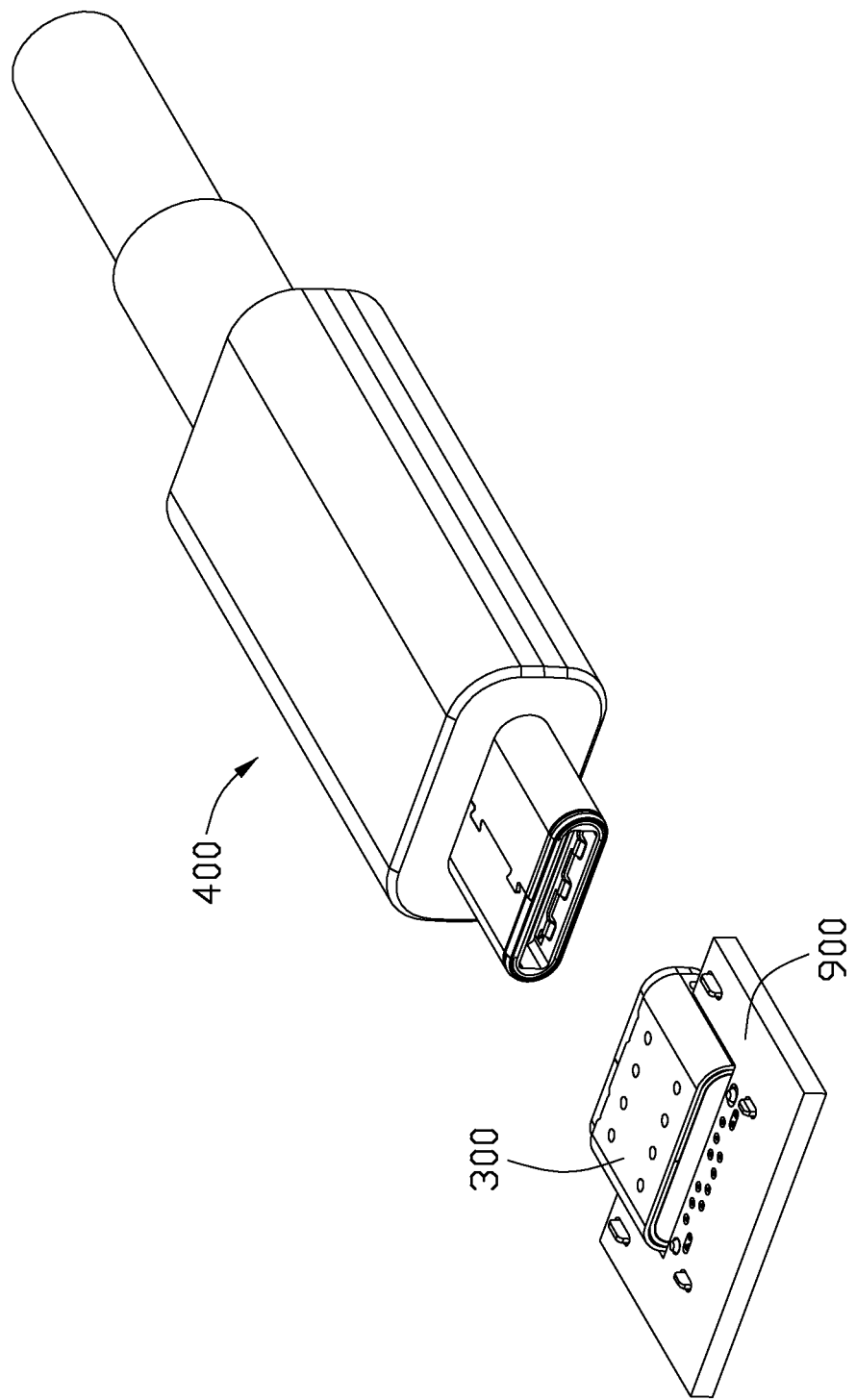
FIG. 15 is a rear exploded perspective view of the receptacle connector and the plug connector of FIG. 13.

As referring to FIGS. 5(A)-7, the receptacle connector 100 includes the insulative housing 11 with the mating tongue 101 forwardly extending in a capsular mating cavity 102 of the metallic shell 12 which encloses the housing 11. Opposite upper and lower rows of contacts 13 are disposed in the housing 11 with corresponding contacting sections 132 seated upon opposite surfaces of the mating tongue 101. A step structure 112 is formed around a root of the mating tongue 101. A one piece metallic EMI collar 15 includes a loop structure 151 intimately surrounding the step structure 112 so as to have a front resilient region 261 of the EMI plate 26 abut thereagainst during mating as best shown in FIG. 12, and a plate structure 152 unitarily extending rearwardly from a rear edge of the loop structure 151 with compression feature 153 thereon to contact the metallic shell 12 (as best shown in FIG. 7). It is noted that because the passageway 114 receiving the corresponding contact 13 is communicative with an exterior in the vertical direction, the corresponding contact 13 may be assembled thereinto in the vertical direction instead of forwardly in a front-to-back direction.

The metallic shell 12 of the receptacle connector 100 includes a top/inner part 122 and a bottom/outer part 123 wherein the top/inner part 122 forms the capsular mating cavity 102 while the bottom/outer part 123 forms the corresponding mounting legs 1231 mounted with the corresponding mounting holes 93 (labeled in FIG. 1) in the printed circuit board 900.

As shown in FIG. 7, the insulative housing 11 of receptacle connector 100 is composed of the upper piece 113 and a lower piece 114 commonly sandwiching therebetween a middle piece 115 which forms the mating tongue 101. The upper row contacts 13a are associated with the upper piece 113, the lower row contacts 13b with a lower piece 114 and the shielding plate 14 is associated with the middle piece 115. The feature of this embodiment includes a rear portion of the step structure 112 is removed to have a front edge region 116a of the upper piece 114 and the front edge region 116b of the lower piece 114 sandwiched between the middle piece 115 and the loop structure 151 of the EMI collar 15 so as to enhance the strength during mating under some bending.

FIGS. 8-12 show the plug connector 200 which is adapted for mating with the receptacle connector 100 of the first embodiment, which defines a front mating cavity 301 to receiving the mating tongue 101 of the receptacle connector 100. The plug connector 200 includes an insulative housing 21 having a base 211 defining rear receiving cavity (not shown) to receive a front edge region 251 of the paddle card 25, and the front mating cavity 201 to receive the mating tongue 101 of the receptacle connector 100. Two rows of contacts 23 are disposed in the housing by two sides of the mating cavity 201 in the vertical direction and are categorized with signal contacts, grounding contacts and power contacts. A pair of latches 24 are disposed in the housing by two opposite transverse ends of the mating cavity 201 wherein the rear leg 242 of the latch 24 and the tail 231 of the outmost grounding contact 23g are commonly mounted upon the same grounding pad 252 of the paddle card 25 for optimal transmission performance. The pair of latches 24 is transversely jointed together by a transverse bridge 241 which is located between the two rows of contacts 23.

Figure 11:
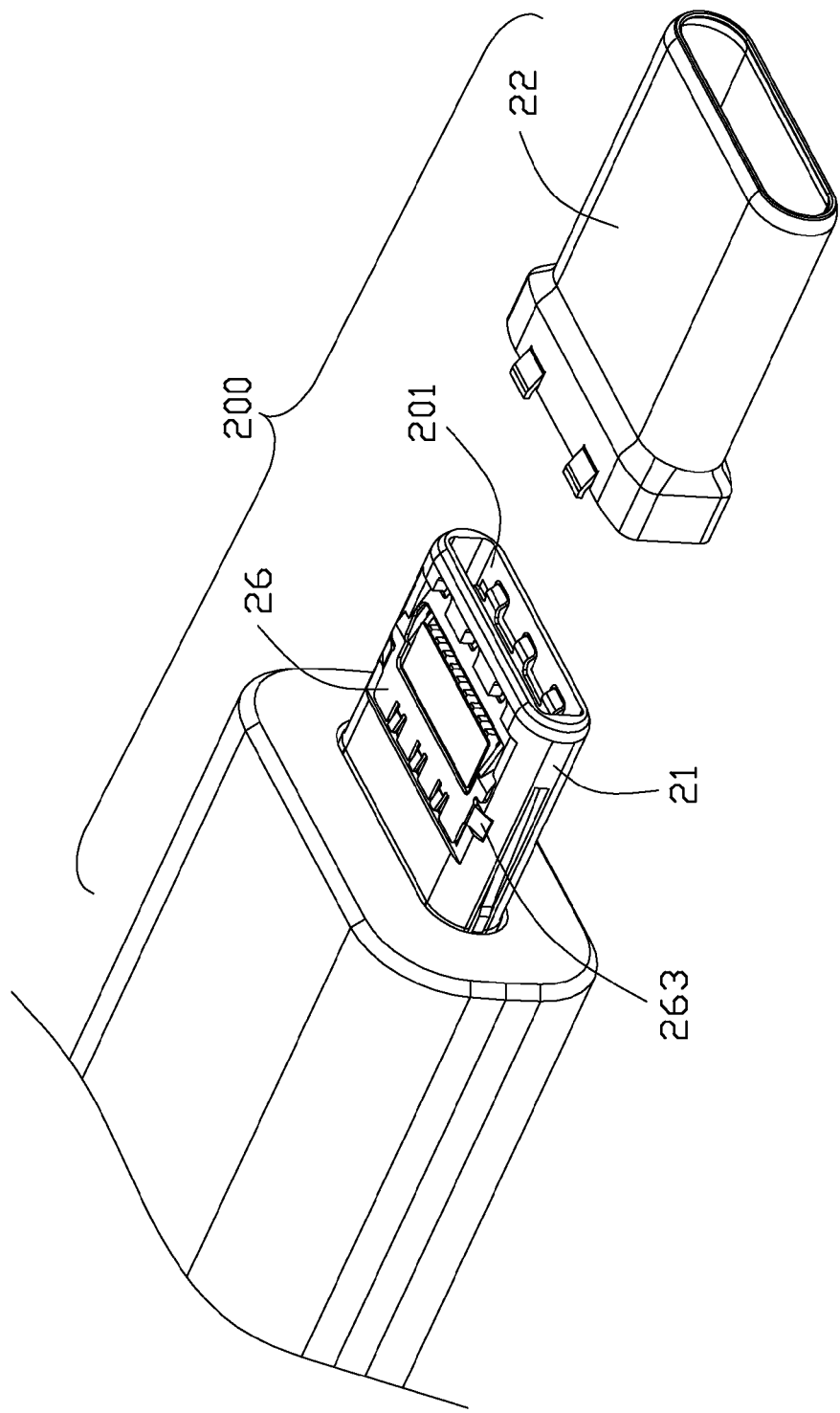
FIG. 11 is an enlarged exploded perspective view of the plug connector of FIG. 8.

As shown in FIGS. 11-12, the insulative housing 21 of the plug connector 200 has a capsular front contour with the rectangular receiving cavity 201 therein and enclosed in a metallic shell 22. Opposite upper and lower rows of contacts 23 are disposed in the housing with corresponding contacting sections 231 extending into the receiving cavity 201. A pair of upper and lower EMI (Electro-Magnetic Interference) plates 26 are enclosed in the shell 22, and each of the EMI plates 26 is sandwiched between the shell 22 and the housing 21 and includes a front resilient region 261 extending inwardly toward the receiving cavity 201 and in front of the contacting sections 231, a rear abutting region 262 to abut against the shell 22, and a pair of side retention regions 263 retainably engaged within corresponding side portions of the housing 21. The shell 22 of the plug connector includes a pair of bent tags (not shown) mechanically and electrically connected to the corresponding grounding pads of the paddle card 25 for EMI.

FIGS. 13-26 show a second embodiment of a plug connector 400 mated with a receptacle connector 300 mounted in the notch 92 of the printed circuit board 900, which is similar to the first embodiment as shown in FIGS. 1-12 with some different which will be described hereinafter.

Figure 16:
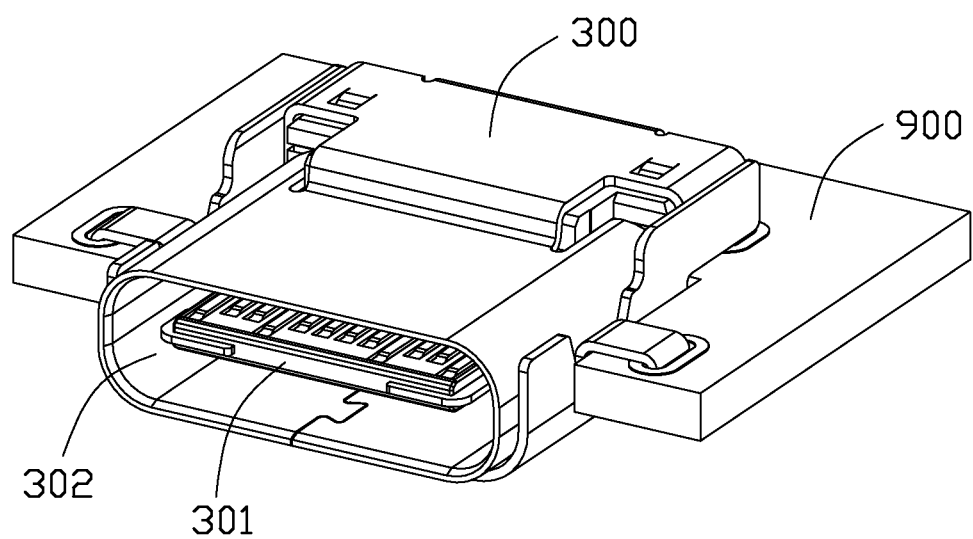
FIG. 16 is a front perspective view of the receptacle connector on the printed circuit board of FIG. 13.
Figure 17:
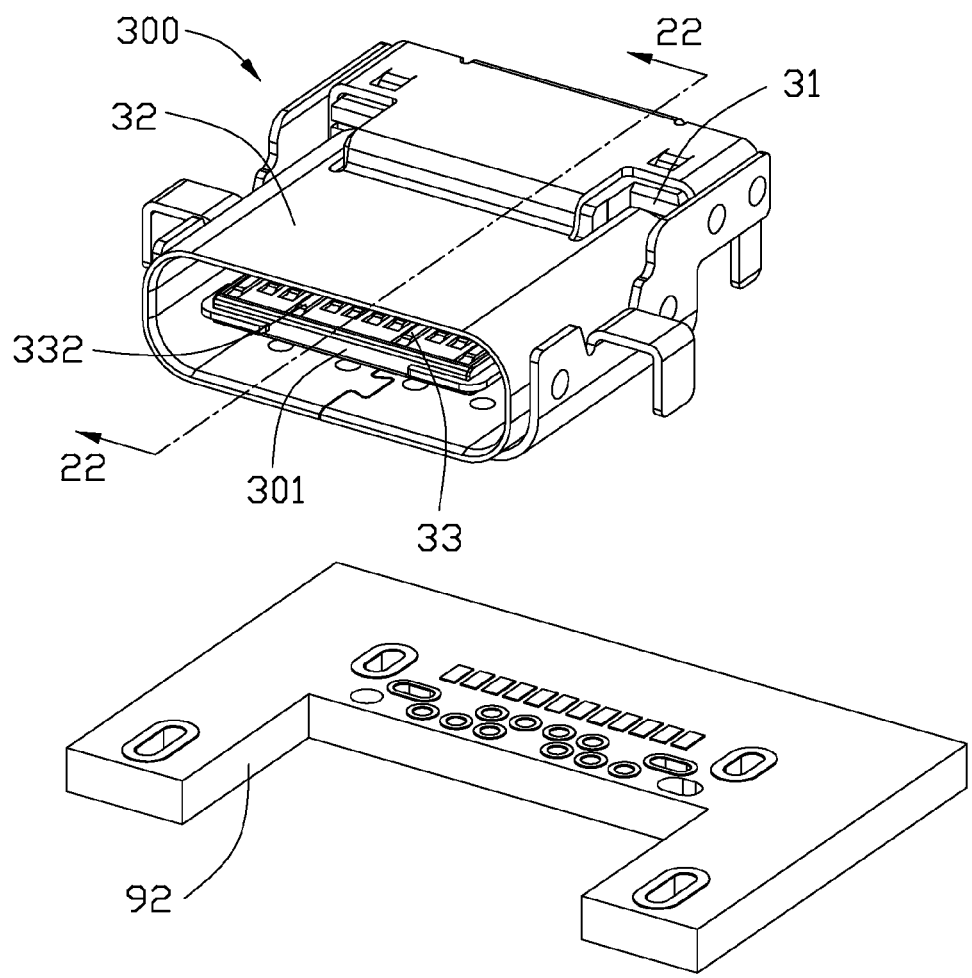
FIG. 17 is a front perspective view of the receptacle connector spaced from the printed circuit board of FIG. 13.

Referring to FIGS. 16-17, the receptacle connector 300 includes an insulative housing/contact seat 31 with a mating tongue 301 forwardly extending in a capsular mating cavity 302 of a metallic shell 32 which encloses the housing 31. Opposite upper and lower rows of contacts 33 are disposed in the housing 31 with corresponding contacting sections 332 exposed upon opposite surfaces of the mating tongue 301 in a diagonally symmetrical arrangement mechanically and electrically so as to allow a so-called flappable insertion of the plug connector 400 thereinto. Combination with FIG. 19, a step structure 311 is formed around a root of the mating tongue 301. A one piece metallic EMI collar 35 includes a loop structure 351 intimately surrounding the step structure 311.

Figure 18A:
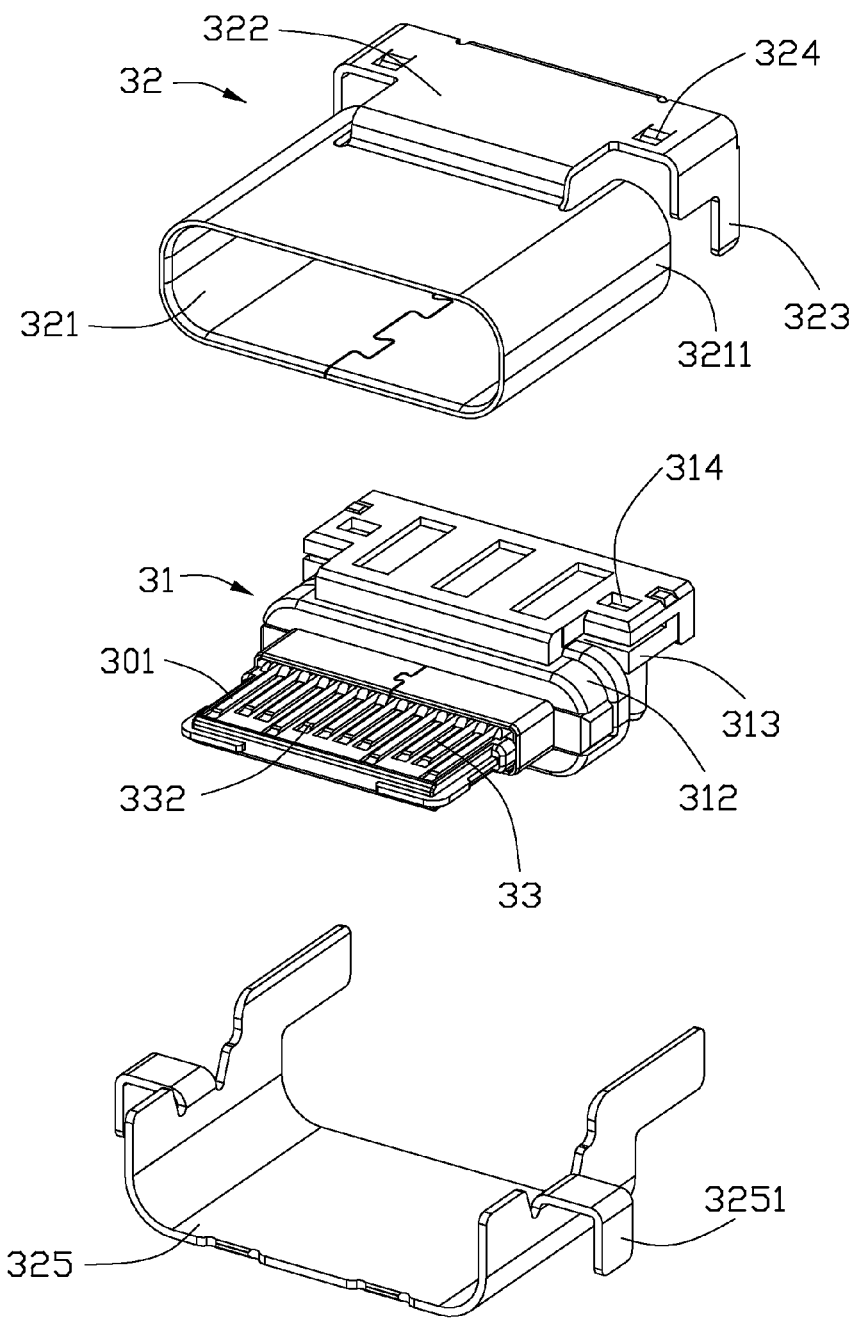
FIG. 18(A) is a front partially exploded perspective view of the receptacle connector of FIG. 13.
Figure 18B:
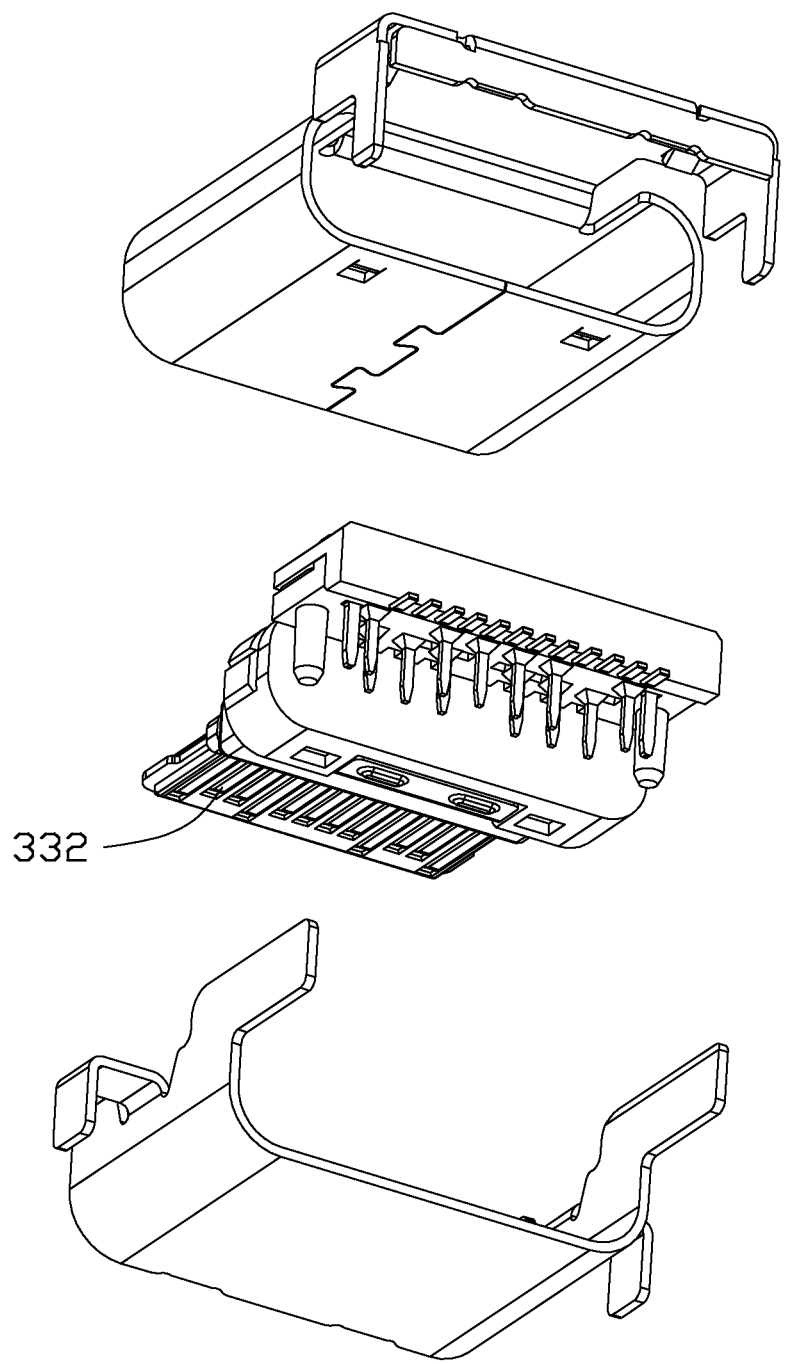
FIG. 18(B) is a rear partially exploded perspective view of the receptacle connector of FIG. 13.

Referring to FIGS. 18(A)-187(B), the insulating housing 31 further includes a retaining base 312 of a capsular shape, the mating tongue 301 extending forward from the retaining base 312 and a rear mounting portion 313 extending rearward from a top edge of the retaining base 312. The step structure 311 is disposed at a joint of the mating tongue and the retaining base. The metallic shell 32 includes a capsular main portion 321 surrounding the mating tongue 301 to define said mating cavity 302 with a rear edge 3211 being retained on the retaining base 312, and a rear top portion 322 extending rearward and covering on the rear mounting portion 313 of the insulating housing. The metallic shell 32 further includes a pair of mounting legs 323 extending downwards from lateral sides of the rear top portion 322 for mounting to the printed circuit board 900 and a pair of locking tabs 324 received in the recesses 314 of the rear top portion 313 after the metallic shell 32 is rearwardly assembled to the housing 31 in a front-to-back direction. A metallic bracket 325 is soldered under the shell 32 and forms a pair of supporting legs 3251 mounted to the printed circuit board 900 for supporting the receptacle connector 300 within the notch 92 of the printed circuit board.

As best shown in FIG. 20(A)-20(B), the insulating housing 31 is composed of the upper piece 37 and a lower piece 38 commonly sandwiching therebetween a middle piece 39 which forms the mating tongue 301. The upper row contacts 33a are associated with the upper piece 37, the lower row contacts 33b associated with a lower piece 38 and the shielding plate 34 is associated with the middle piece 39 via an insert molding process wherein the contacting sections 332 of the upper row contacts 33a and those of the lower rows contacts 33b are seated upon opposite upper surface and lower surface of the mating tongue 301, respectively, as mentioned before. A rear portion of the step structure 312 is removed to, as best shown in FIG. 19, have a front edge region 371 of the upper piece 37 and the front edge region 381 of the lower piece 38 sandwiched between the middle piece 39 and the loop structure 351 of the EMI collar 35 so as to enhance the strength during mating under some bending.

In this embodiment, the shielding plate 34 defines a rear portion 342 extending from the mating tongue 301 and a pair of mounting legs 343 bending downwards so as to efficiently separate the upper row contacts 33a and the lower row contacts 33b from each other wherein the upper row contacts 33a form the surface mount type tail sections 333a while the lower row contacts 33b form the through hole type tail sections 333b. The lower piece 38 includes a pair of mounting posts 382 for mounting the housing 31 to the printed circuit board 900.

Figure 21A:
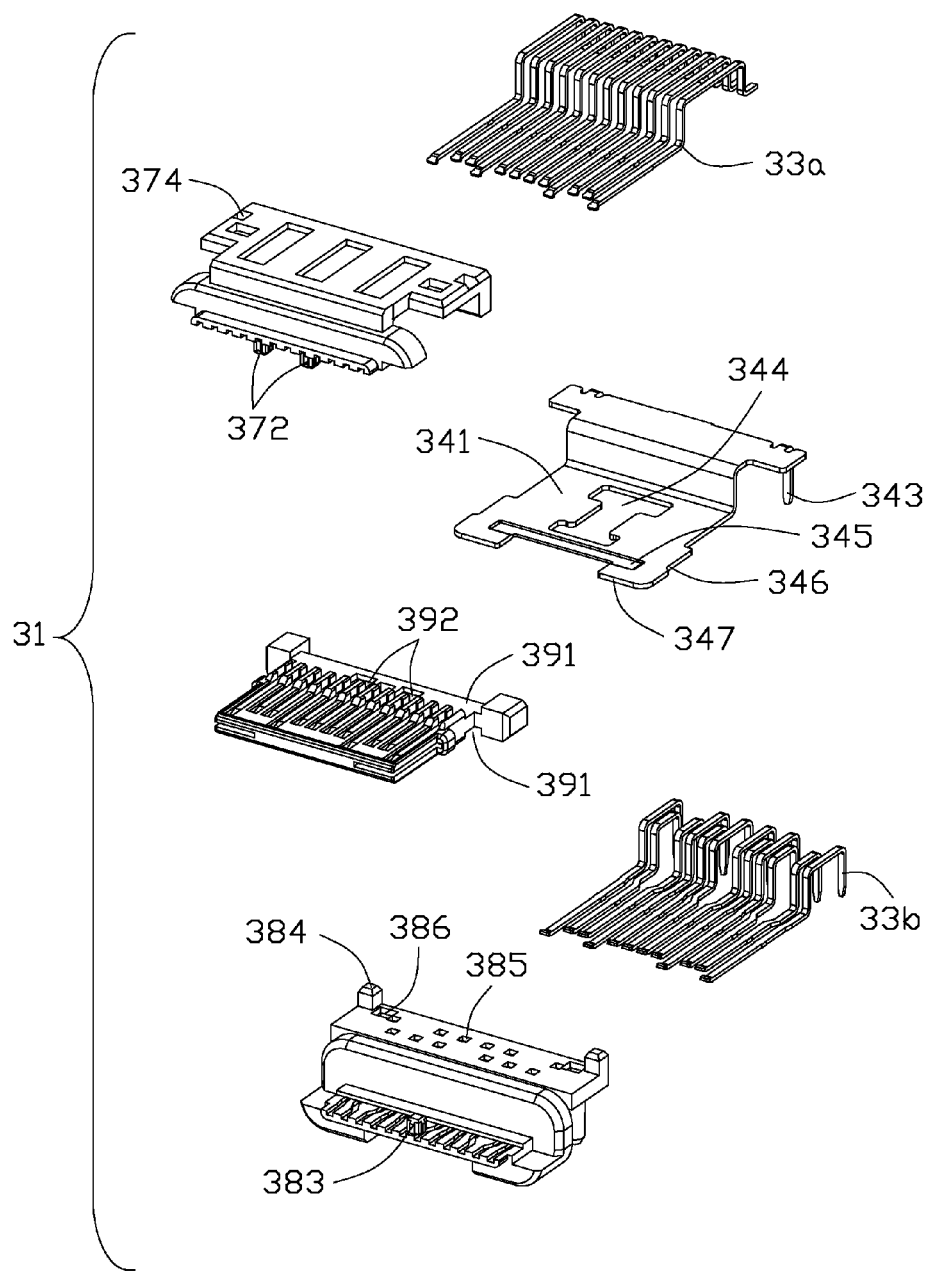
FIG. 21(A) is a front partially exploded perspective view of the receptacle connector of FIG. 13 to show the housing and the contacts thereof.
Figure 21B:
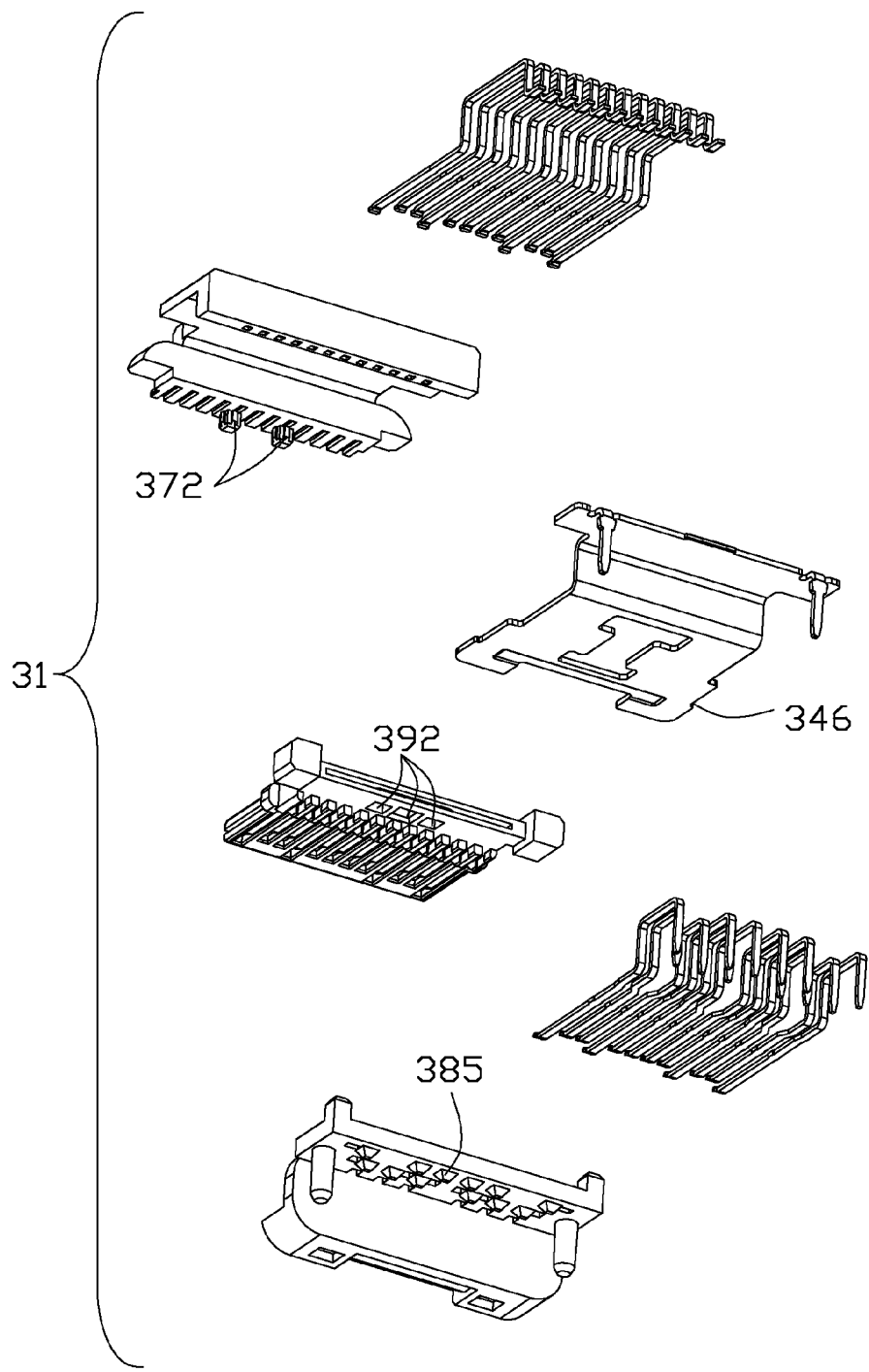
FIG. 21(B) is a rear partially exploded perspective view of the receptacle connector of FIG. 13 to show the housing and the contacts thereof.
Figure 22:
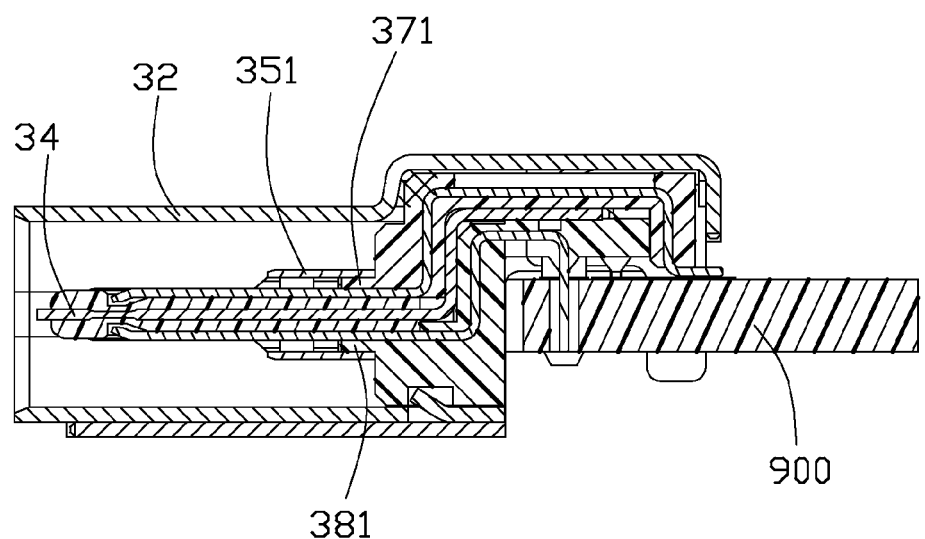
FIG. 22 is a cross-sectional view of the receptacle connector on the printed circuit board of FIG. 13.
Figure 23:
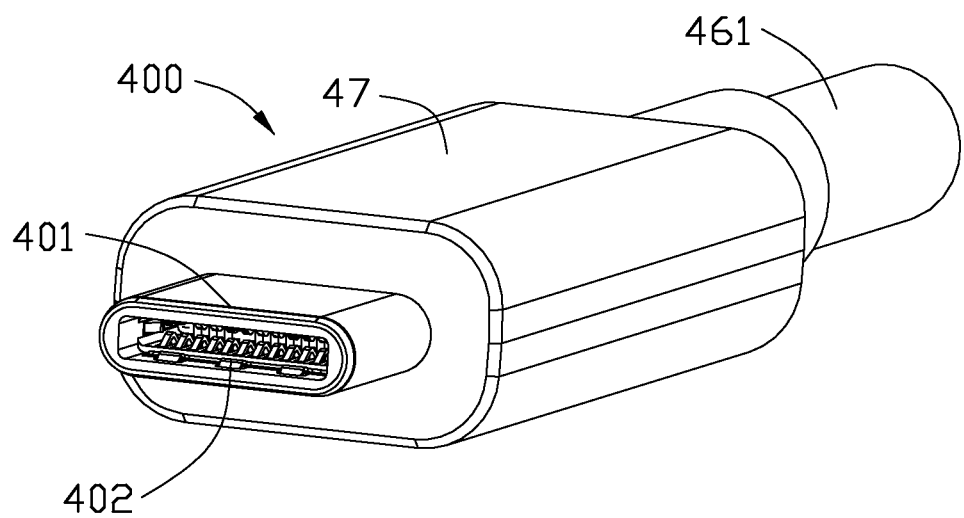
FIG. 23 is a front assembled perspective view of the plug connector of FIG. 13.
Figure 24A:
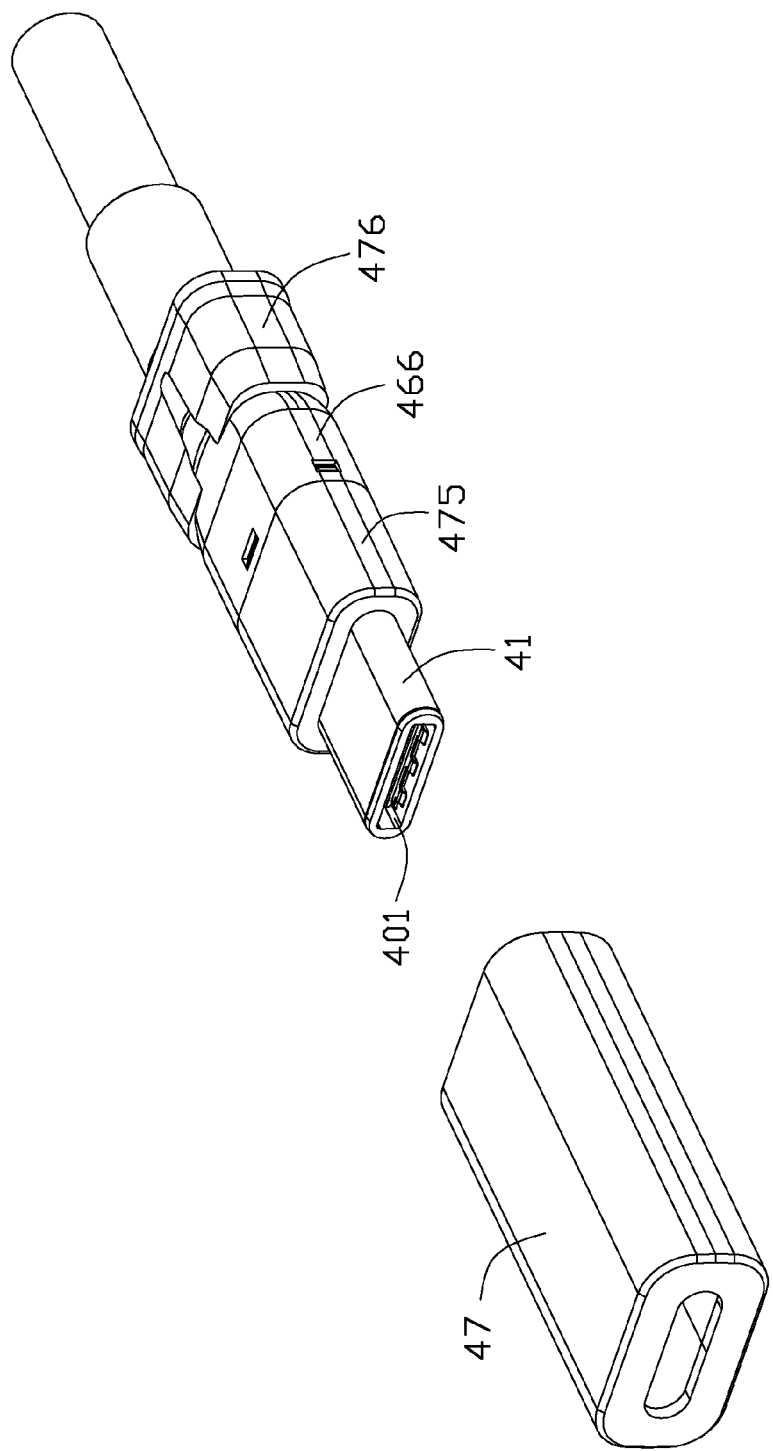
FIG. 24(A) is a front partially exploded perspective view of the plug connector of FIG. 13 wherein the cover is removed away from the remainder.
Figure 24B:
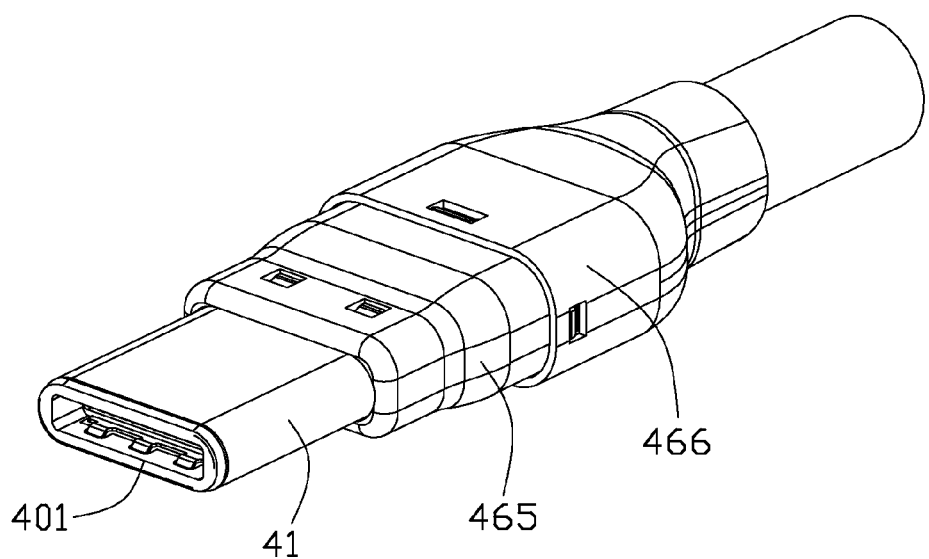
FIG. 24(B) is a front partially exploded perspective view of the plug connector of FIG. 23(A) wherein the front and rear over-moldings have been further removed.
Figure 25A:
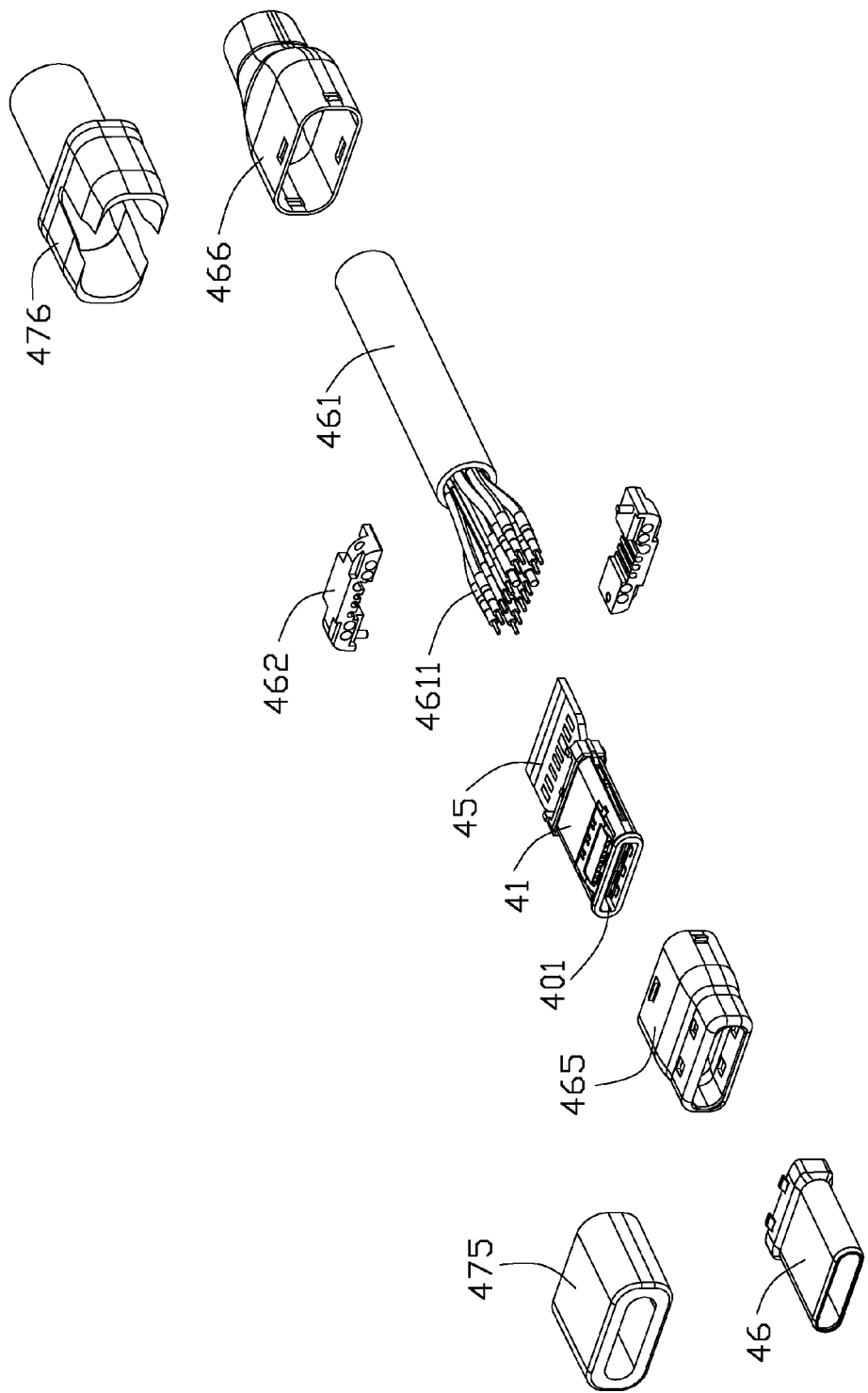
FIG. 25(A) is a front partially exploded perspective view of the plug connector of FIG. 13 without the cover thereof.
Figure 25B:
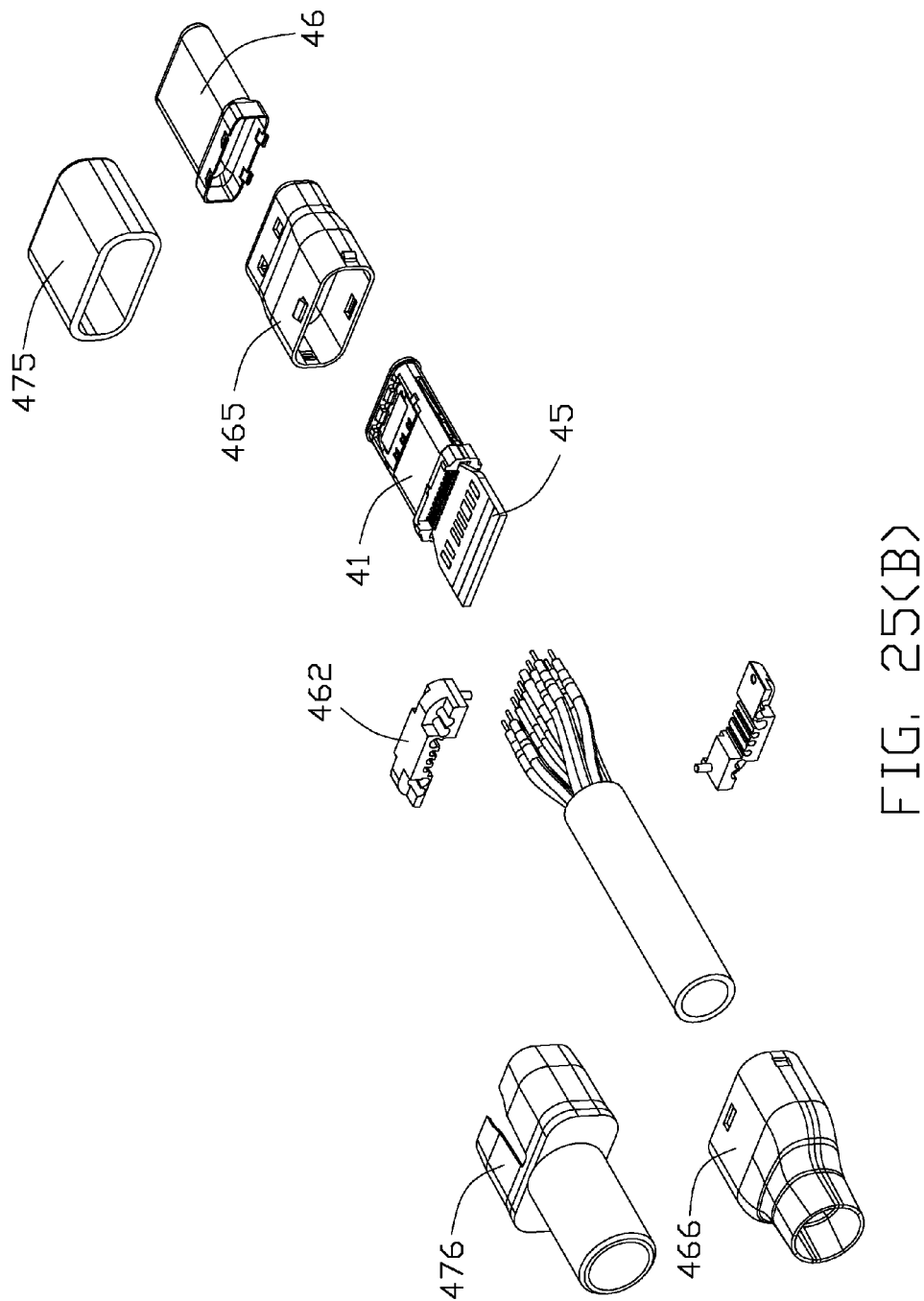
FIG. 25(B) is a rear partially exploded perspective view of the plug connector of FIG. 24(A).

Referring to FIGS. 21(A)-21(B), in this embodiment, the shielding plate 34 defines an opening 344 and a thinner area 345 at a front portion 341 for both securing and impedance consideration. Notably, the shielding plate 34 forms a front edge section 347 extending forwardly beyond a front edge of the mating tongue 301 for anti-mismsting consideration, and a pair of lateral edge sections 346 for locking with a latch 44 of the plug connector 400 (illustrated later).

Figure 19:
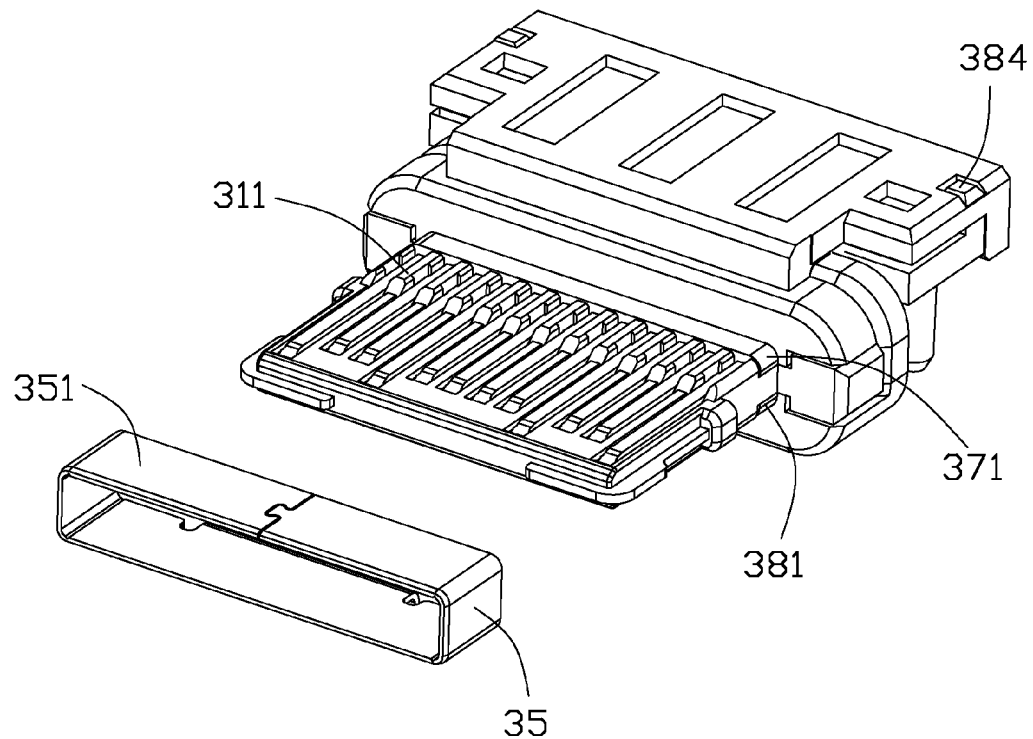
FIG. 19 is a front partially exploded perspective view of the receptacle connector of FIG. 13 without the shield thereof.

The middle piece 39 forms a pair of recesses 391 to respectively receive the front edge region 371, 381 of the upper and lower pieces 37, 38 as labeled in FIG. 20(A) and holes 392 defined in the recesses 391 to respectively receive corresponding protrusion posts 372 of the upper piece 37 for securing the upper piece 37 and the middle piece 39 therebetween in a stacked manner wherein the lower piece 38 further forms a pair of upward locating posts 384 received within the corresponding recesses 374 in the upper piece 37, combination with FIG. 19. In this embodiment, the lower piece 38 defines a plurality of through holes 385 and 386 to receive the tail sections 333b of the lower row contacts 33b and the mounting legs 343 of the shielding plate 34 to extend therethough as an alignment spacer. In brief, the shielding plate 34 is essentially multifunctional to perform shielding, grounding, reinforcing, anti-mis-mating and locking.

Figure 26A:
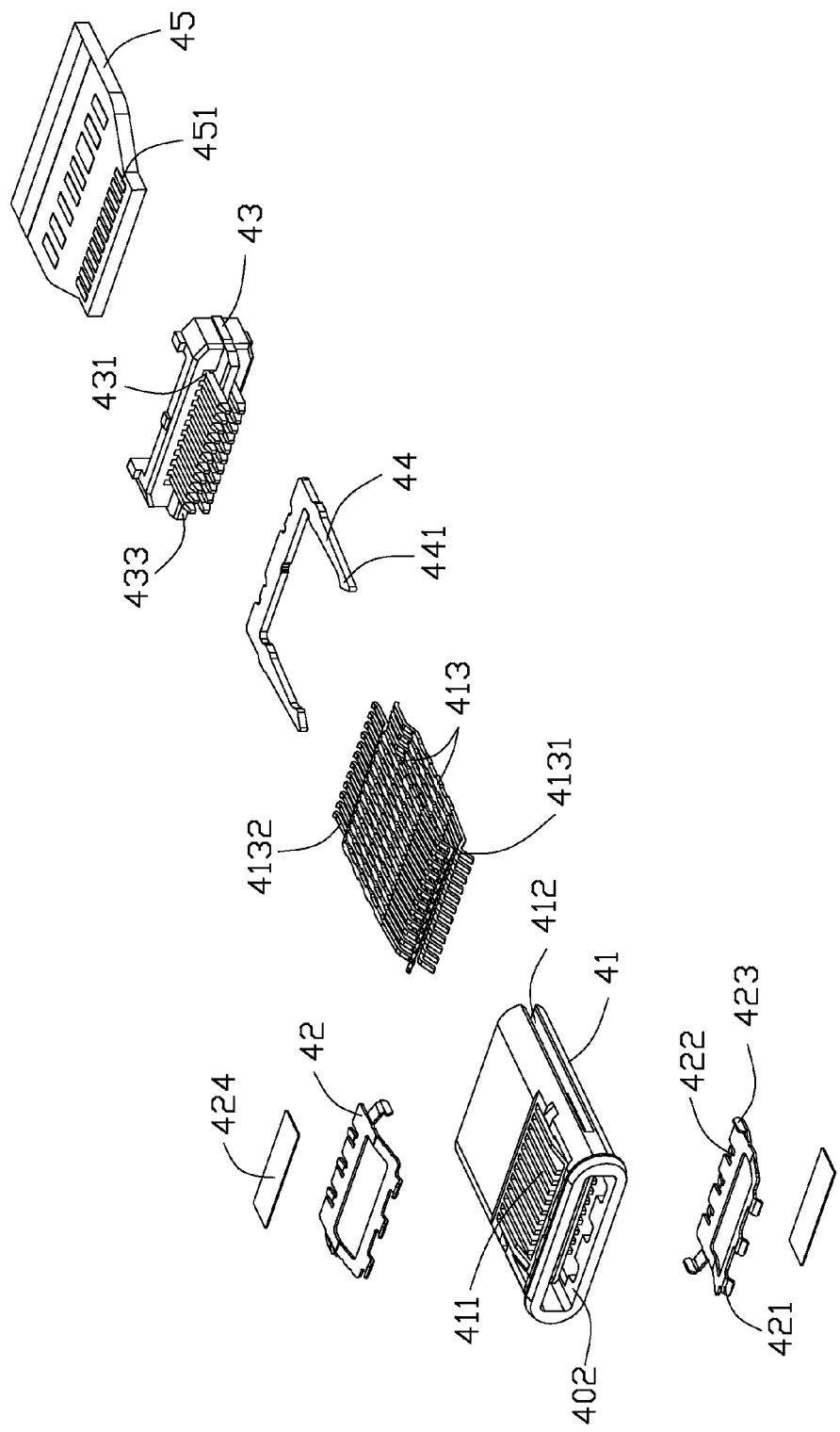
FIG. 26(A) is a front partially exploded perspective view of the plug connector of FIG. 24(A) by removal of additional parts therefrom.
Figure 26B:
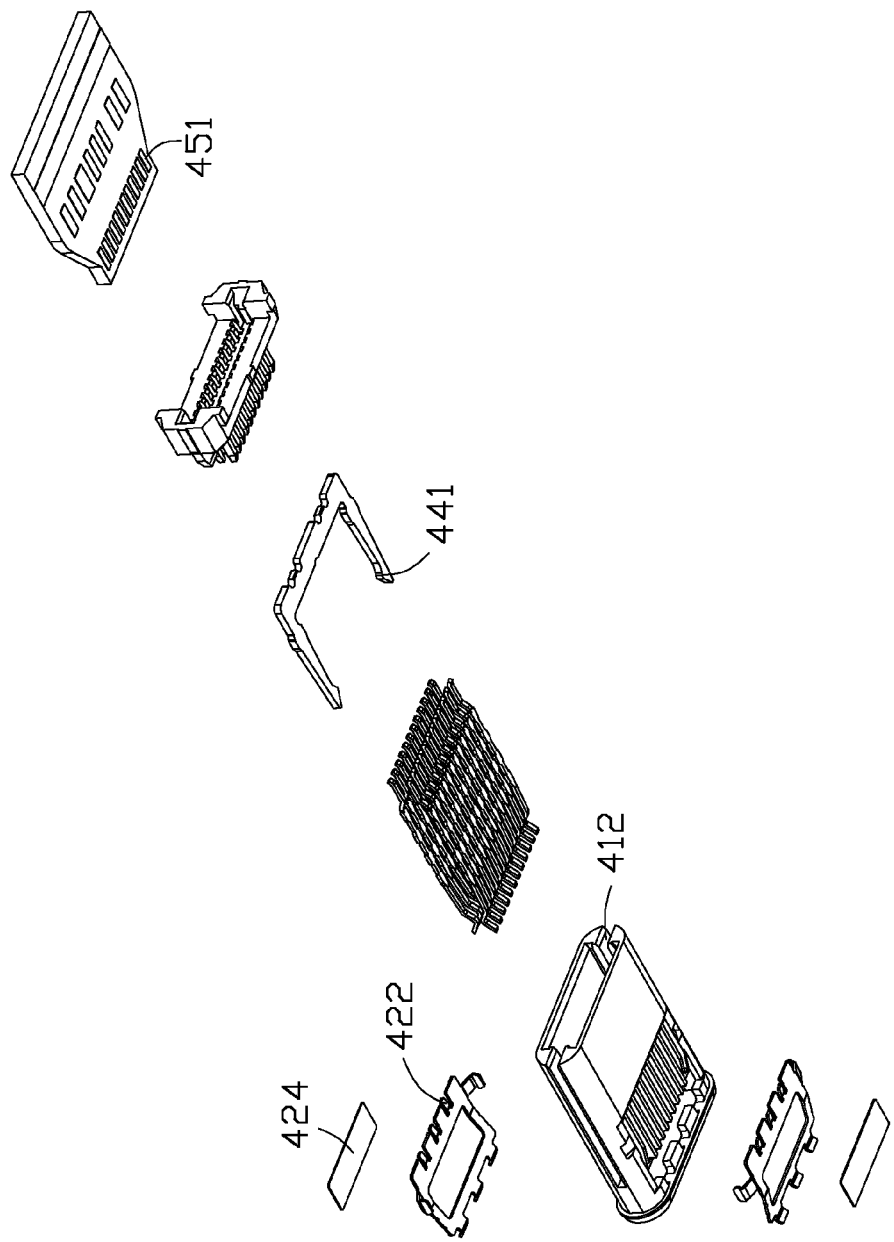
FIG. 26(B) is a rear partially exploded perspective view of the plug connector of FIG. 25(A).
Figure 27:
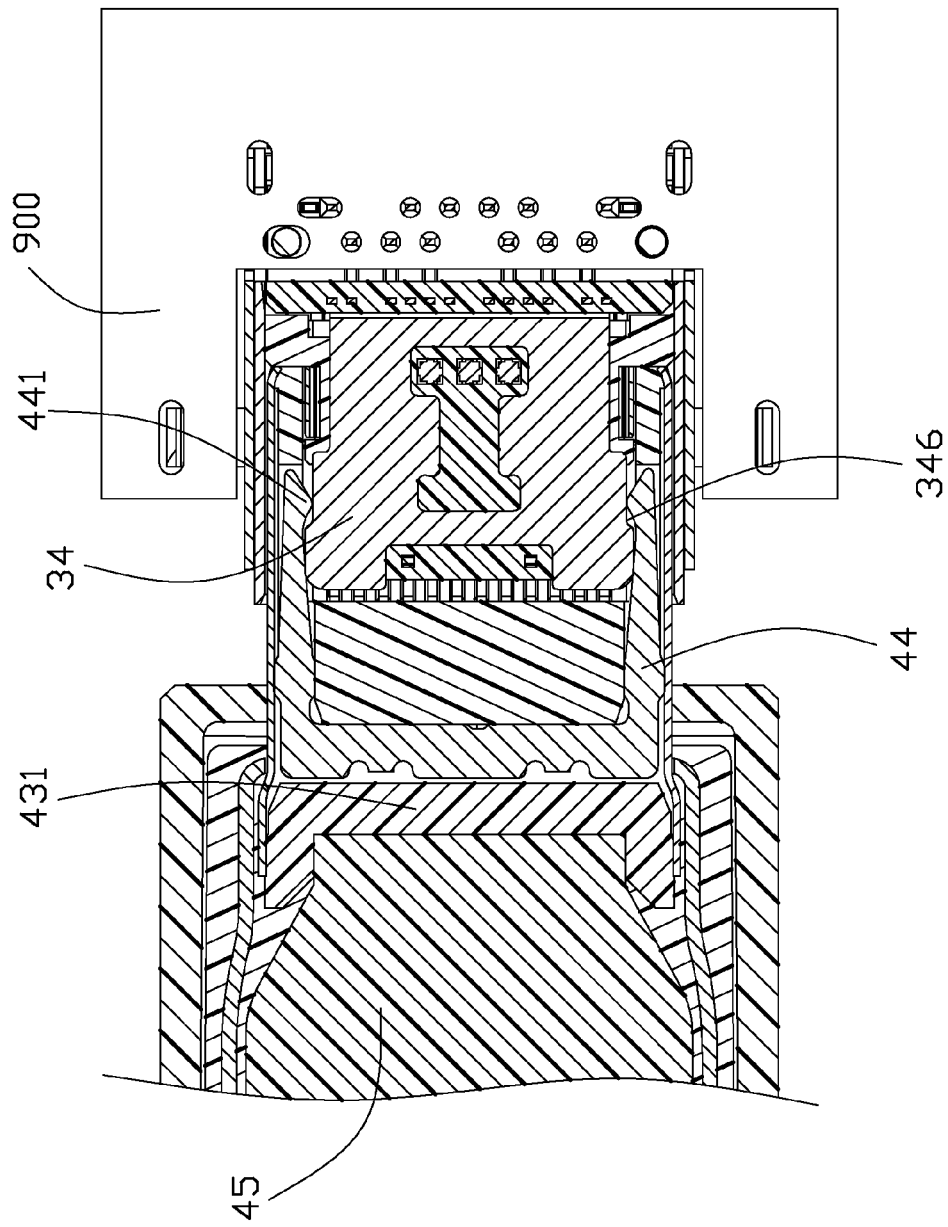
FIG. 27 is a cross-sectional view of the mated plug connector and receptacle connector of FIG. 13 to show how the latch of the plug connector is lockable engaged with the shielding plate of the receptacle connector.

Referring to FIGS. 23-26(B) and further FIG. 27, the plug connector 400 includes a mating end 401 with a rectangular cavity 402, a cable 461 extending rearwards and a molded insulative cover 47 around the mating end 401 and the cable 461.

Combination with FIG. 26(A)-26(B), the plug connector 400 includes an insulative housing 41 having a capsular front contour with the rectangular receiving cavity 402 therein and enclosed in a metallic shell 46. Opposite upper and lower rows of contacts 413 are disposed in the corresponding passageways 411 of the housing with corresponding contacting sections 4131 extending into the receiving cavity 402. A pair of upper and lower EMI (Electro-Magnetic Interference) spring plates 42 are enclosed in the shell, and each of the EMI spring plates 42 is sandwiched between the shell 16 and the housing 41 and includes a front resilient region 421 extending inwardly toward the receiving cavity 402 and in front of the contacting sections 4131, a rear abutting region 422 to abut against the shell 16, and a pair of side retention regions 423 retainably engaged within corresponding side portions of the housing 41. The front resilient region 421 is in a form of slant-inwardly tabs extending therefrom. The rear abutting regions 422 is in a from of a plurality of slant-outwardly tabs splitting therefrom. A pair of insulative tapes 424 are disposed upon two opposite sides of the housing 21 so as to isolate the contacting section 4131 from the shell 46. A spacer 43 is located behind the housing and defines a plurality of passages 431 through which the tail sections 4132 of the contacts 413 rearwardly extend. A recessed region is formed in a rear face of the spacer 43 to receive a front edge region of a paddle card 45 wherein the tail sections 4132 of the contacts 413 extending through the corresponding passages 431, are soldered upon the corresponding pads 451. The spacer 43 forms a forward extending blade 433 with a pair of forward protrusions on two faces in the vertical direction to be commonly inserted into a back side of the housing 41 wherein the blade 433 is essentially received in the side slots 412 of the housing 41. A U-shaped metallic latch 44 received in the side slots 412 of the housing 41 with a pair of locking heads 441 extending into the two opposite lateral sides of the receiving cavity 401 to lock with the lateral edge sections 346 of the shielding plate 34 of the receptacle connector 300 during mating. Understandably, the latch 44 is restrained by the blade 433, the slots 13 and an interior rear face of the housing 41.

Referring to FIG. 24(A)-27, a cable 461 behind the paddle card 45, encloses a plurality of wires 4611 regulated by a pair of organizer 462 to be soldered upon a rear region of the paddle card 45. An auxiliary rear shell 465 grasps the shell 46 to shield the paddle card 45, and a clipper 466 grasps the cable 461 behind the paddle card 45. Opposite front overcoat 475 and rear overcoat 476 are overmolded upon the rear shell 465 and the clipper 446, respectively. Finally, the cover 47 essentially fully covers the clipper 466, the front overcoat 475 and the rear overcoat 476. During mating, the mating tongue 301 is received in the receiving cavity 401 with the corresponding contacting sections 322 of the contacts 32 of the receptacle connector 300 connected to the contacting sections 4131 of the contacts 413 of the plug connector 400 wherein the latch 44 is locked with the shielding plate 34, and the front resilient region 421 of the spring plate 42 contacts the collar 35.

Figure 28:
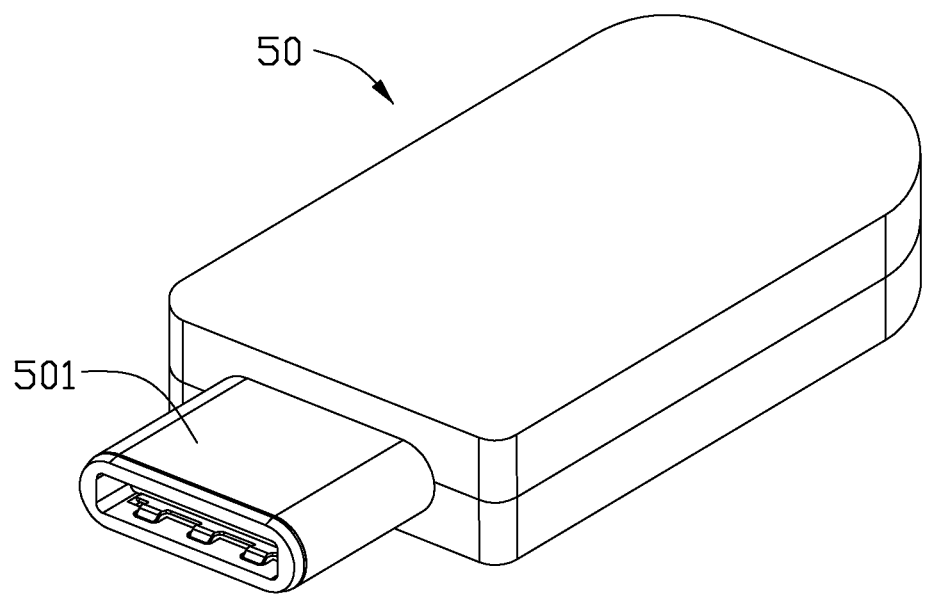
FIG. 28 shows the portable hard disk equipped with an interface of the plug connector for mating with the receptacle connector according to the invention.
Figure 29A:
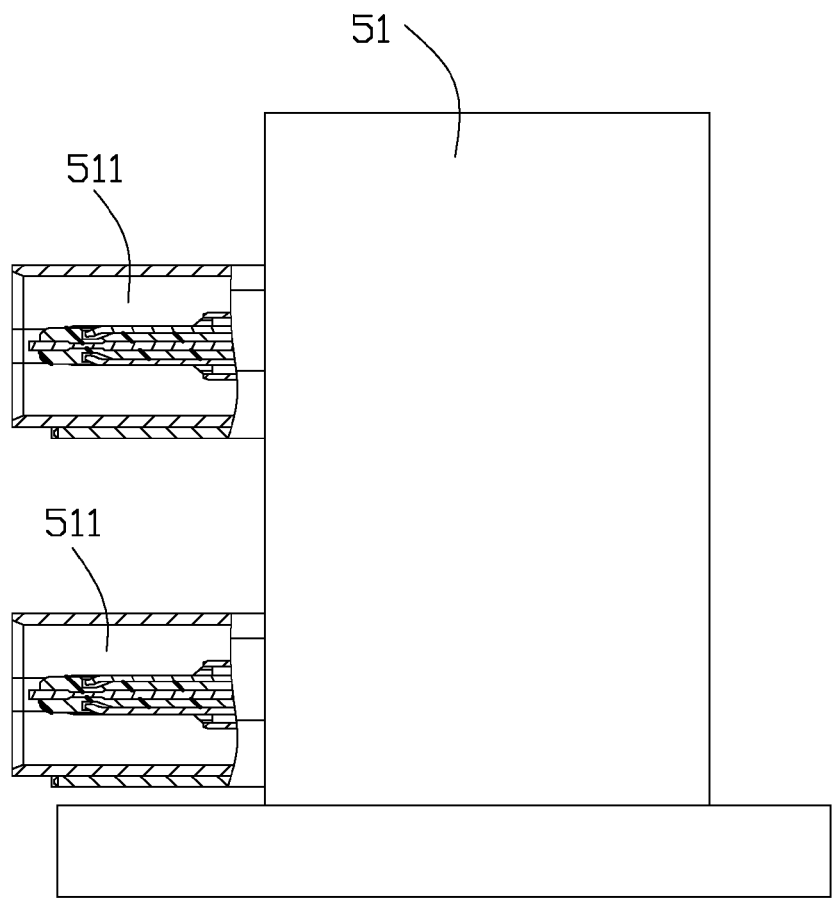
FIG. 29(A) shows a dual port connector assembly having one unitary housing equipped with a pair of stacked receptacle connector units in the vertical direction wherein the mating cavities of the pair of receptacle connector units are spaced from while facing each other in the vertical direction according to the invention.
Figure 29B:
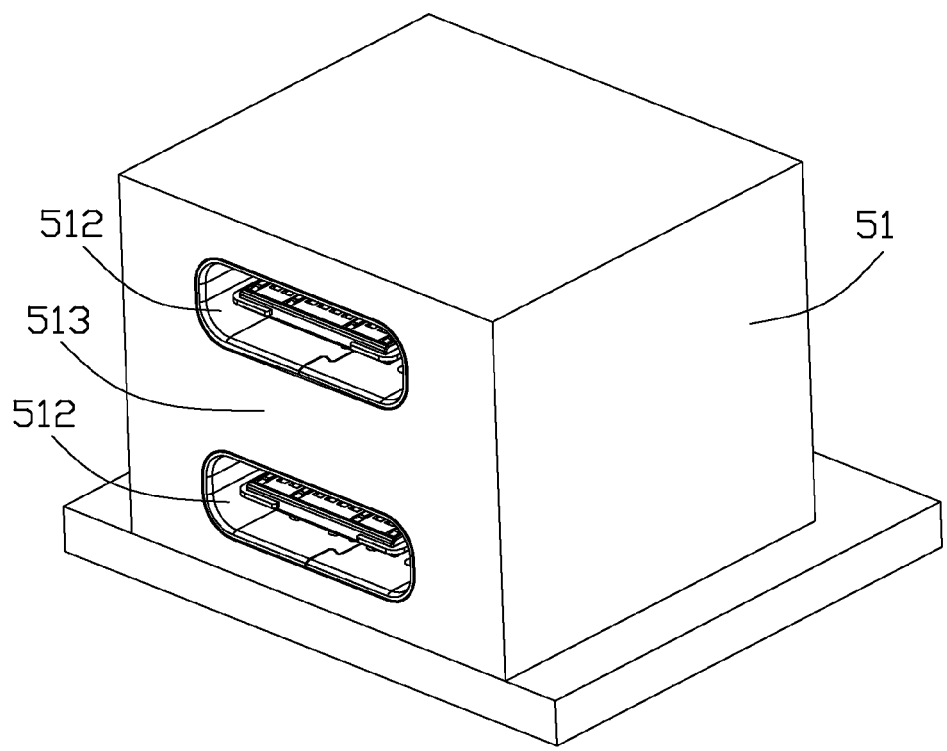
FIG. 29(B) shows a dual port connector assembly having one unitary housing equipped with a pair of stacked receptacle connector units in the vertical direction wherein the mating cavities of the pair of receptacle connector units are spaced from while isolated from other by a partition of the housing in the vertical direction according to the invention.

FIG. 28 shows a portable hard disk 50 equipped with an interface 501 of the plug connector according to the invention, while the contact tails are mounted to an internal printed circuit board (not shown) therein. FIG. 29(A) shows a connector kit 51 with two spaced receptacle connectors according to the invention, stacked upon each other and integrally retained by a same housing wherein the mating ports 511 of the two receptacle connectors spaced from each other in the vertical direction with separation. FIG. 29(B) shows a connector kit 51 similar to that in FIG. 29(A) but with the two mating ports 512 are separated from each other via a partition wall 513 of the housing and each mating port 512 is hidden behind a front face of the housing. FIGS.

Figure 32:
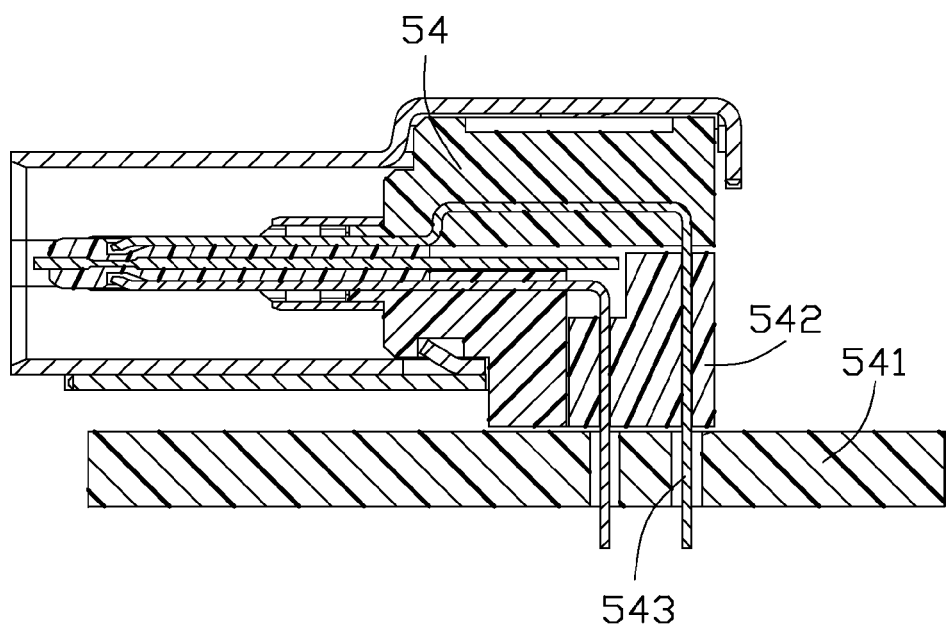
FIG. 32 shows a receptacle connector according to the invention wherein right angle tail sections of the contacts are regulated by a spacer to be mounted to the prince circuit board.
Figure 33A:
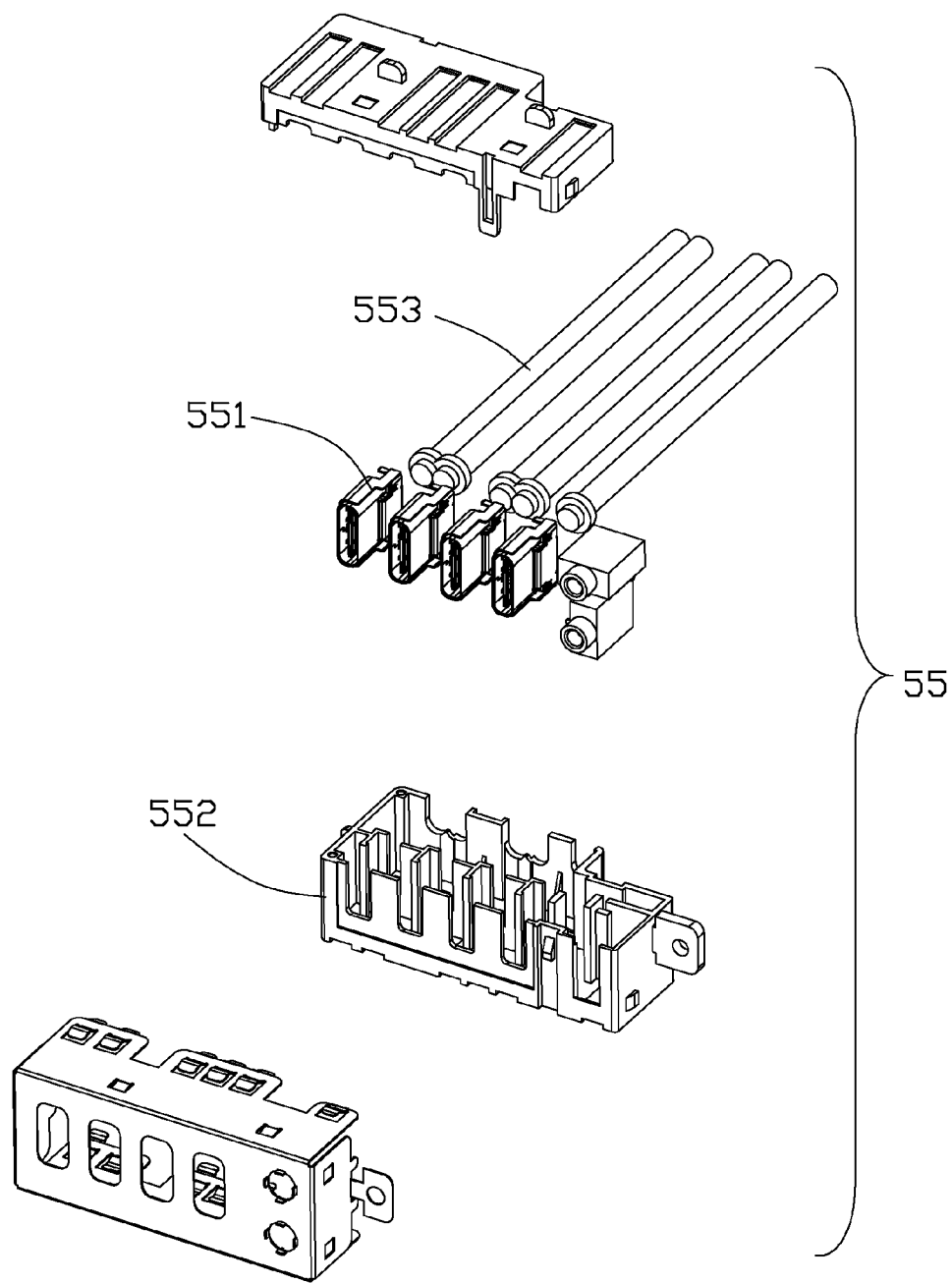
FIG. 33(A) shows a receptacle connector cable assembly according to the invention wherein the tail sections of the contacts are straight and directly connected to the corresponding wires of a cable.
Figure 33B:
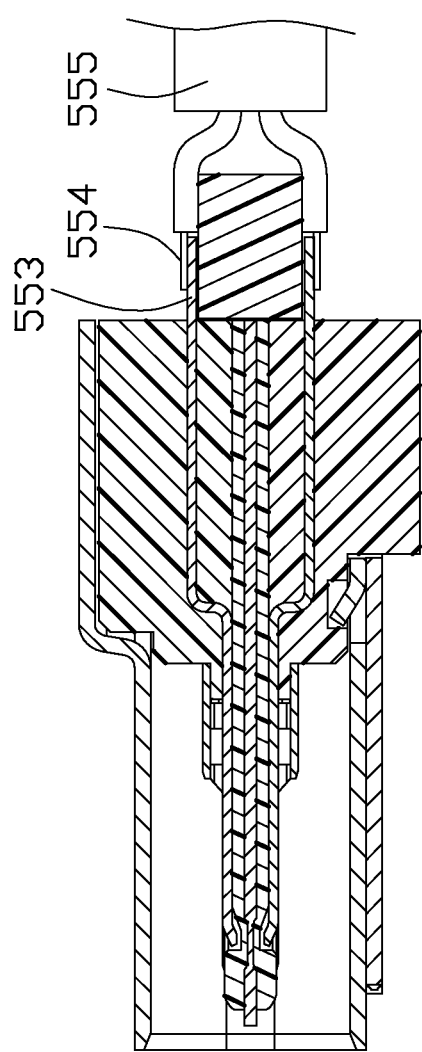
FIG. 33(B) shows a receptacle connector assembly of FIG. 20(A) installed within a front I/O bracket as a kit for the multiple usage.
Figure 34A:
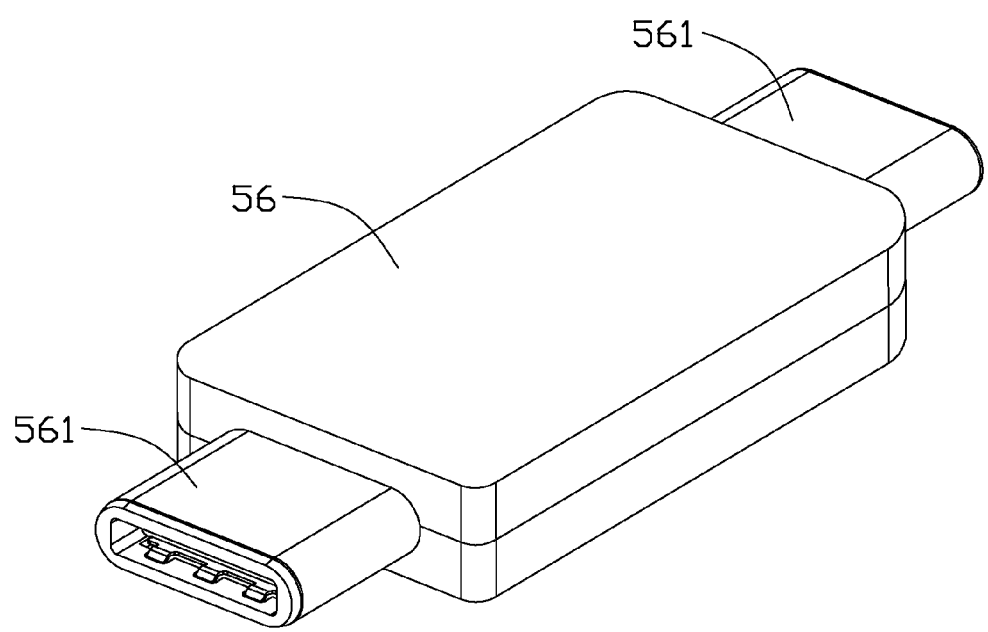
FIG. 34(A) shows an adaptor connector assembly according to the invention wherein both two opposite ports are of the plug type interface while electrically connected vi an internal printed circuit board.
Figure 35:
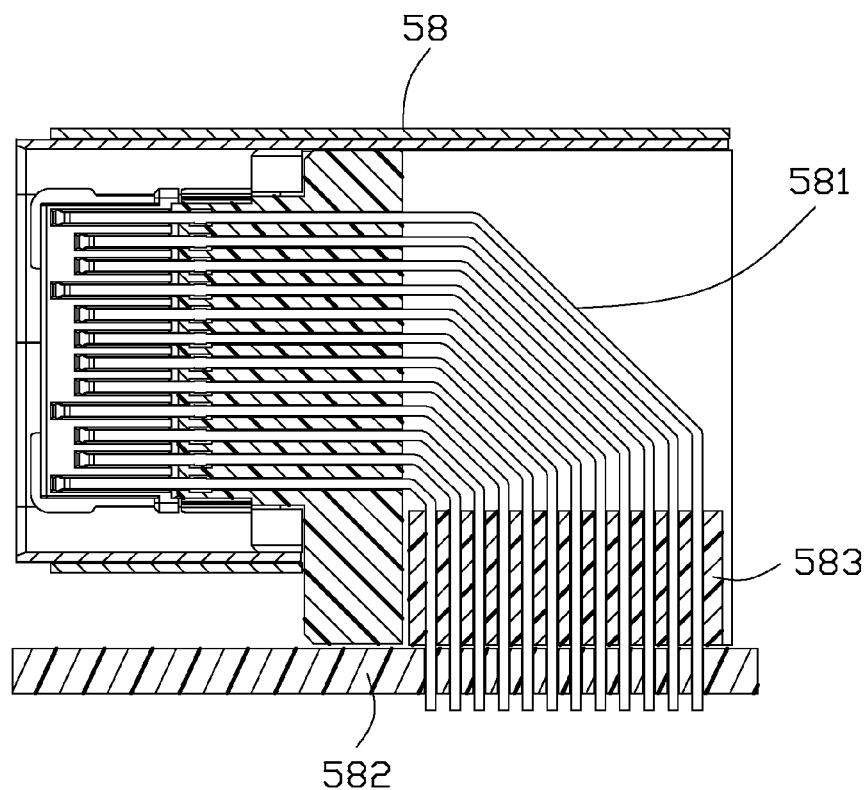
FIG. 35 shows a receptacle connector according to another embodiment of the invention wherein the two rows contacts are arranged side by side and each lies in a vertical plane and mounted upon the printed circuit board.
Figure 36:
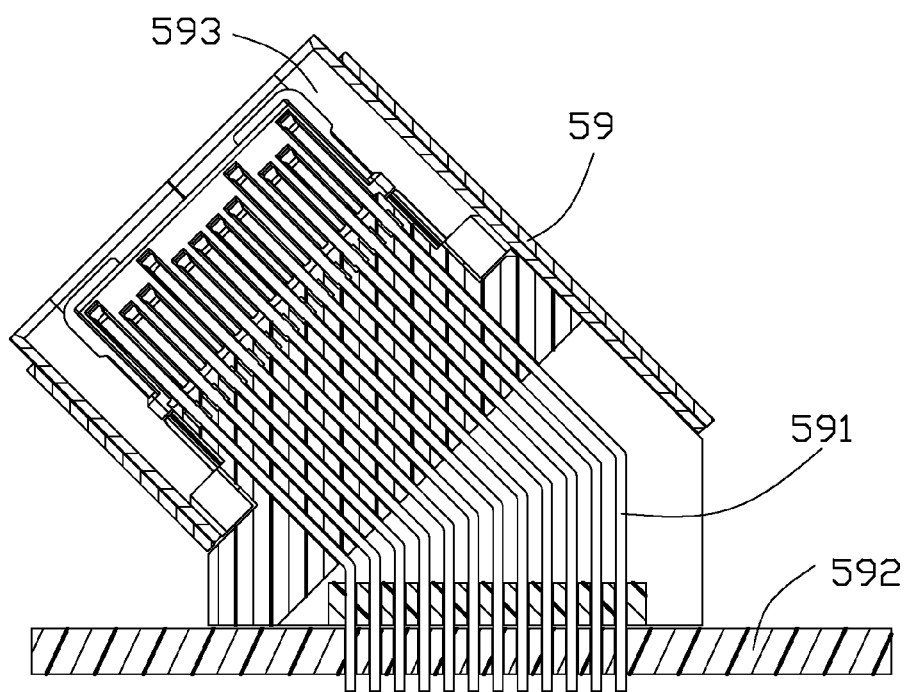
FIG. 36 shows a receptacle connector according to another embodiment of the invention wherein the two rows contacts are arranged side by side and each lies in a vertical plane and mounted upon the printed circuit board while the mating port extends upwardly and obliquely.

30(A) and 30(B) show the two connectors 521/522 similar to those in FIGS. 29(A) and 29(B) except in a side-by-side arrangement instead of a stacked manner. FIG. 31 shows a connector assembly 53 with a common housing 531 having a lower space 532 to receive an independent receptacle connector 533 and an upper space 534 configured compliantly with the mating cavity to receive the corresponding plug of the invention wherein the mating tongue 535 is optionally integrally formed with the whole housing and the shield 536 is rearwardly assembled into the upper space 534. FIG. 32 shows a receptacle connector 54 of the invention mounted upon the printed circuit board 541 with the spacer 542 to align the corresponding tail sections 543 of the contacts. FIGS. 33(A) and 33(B) show a front I/O cable assembly 55 wherein the receptacle connectors 551 of the invention retained in the bracket 552 have the corresponding tail sections 553 of the contacts linked to the wires 554 of the cables 555 which extend rearward out of the bracket 552. FIG. 34(A) shows the adaptor 56 equipped with the interface of the plug connector 561 according to the invention wherein the internal linking between the two opposite mating ports may be via an internal printed circuit board (not shown). FIG. 34(B) shows the adaptor 57 similar to that in FIG. 34(A) except that the mating ports is of the recessed type receptacle connector 571. FIG. 35 shows a receptacle connector 58 according to another embodiment of the invention wherein each row contacts 581 are arranged side by side in a vertical plane and mounted upon the printed circuit board 582 via assistance of the spacer 583. FIG. 36 shows a receptacle connector 59 according to another embodiment of the invention wherein each row contacts 591 are arranged side by side in a vertical plane and mounted upon the printed circuit board 592 while the mating port 593 extends upwardly and obliquely.

Figure 37:
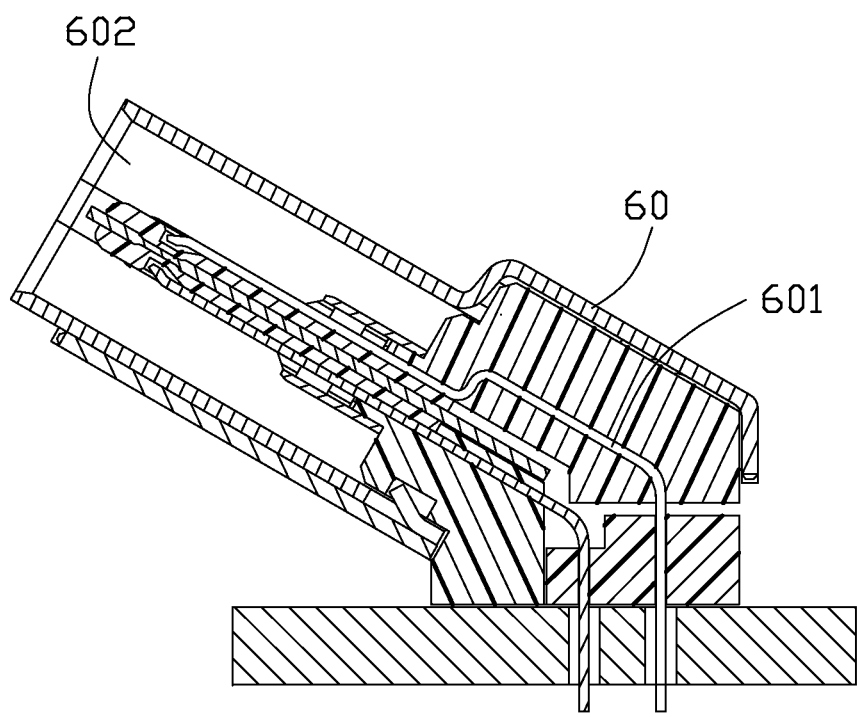
FIG. 37 shows a receptacle connector according to another embodiment of the invention wherein each row contacts are arranged in a transverse direction while the mating port extends upwardly and obliquely.
Figure 38:
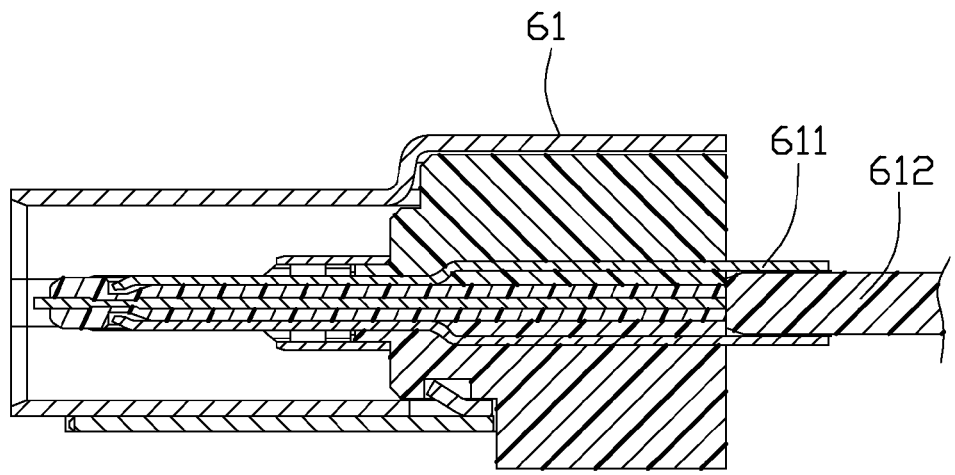
FIG. 38 shows a receptacle connector according to another embodiment of the invention wherein each row contacts are arranged in a transverse direction and the tail sections of the two row contacts commonly sandwich the printed circuit board.
Figure 39:
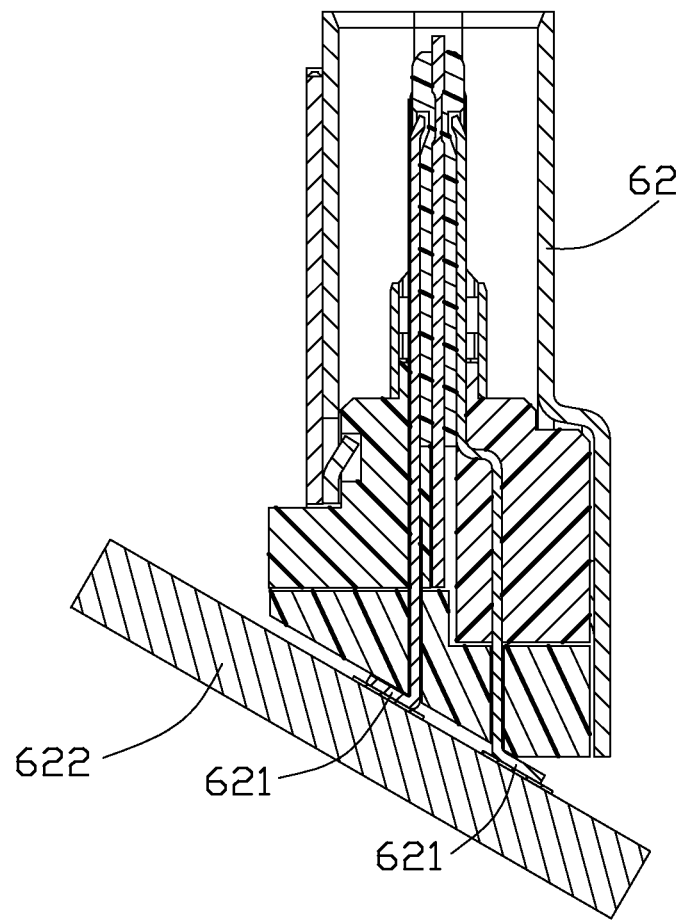
FIG. 39 shows a receptacle connector according to another embodiment of the invention wherein each row contacts are arranged in a transverse direction and the tail sections of the two row contacts are surface mounted upon an obliquely extending printed circuit board.
Figure 40:
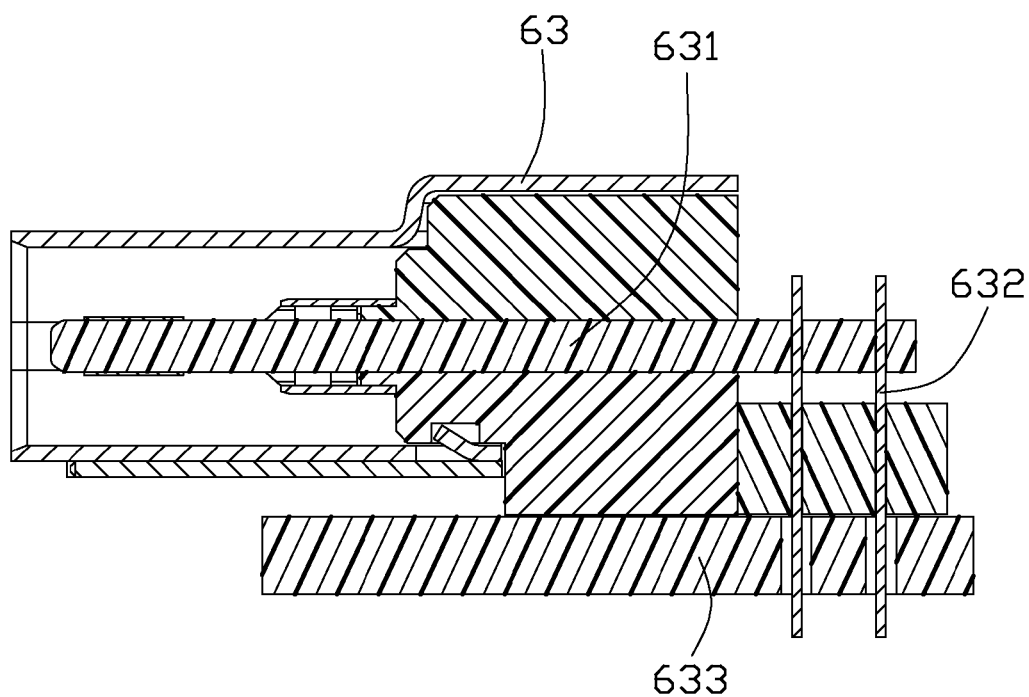
FIG. 40 shows a receptacle connector according to another embodiment of the invention wherein the mating tongue is made by a printed circuit board which can be an internal PCB adapted to connect to the mother board.

FIG. 37 shows a receptacle connector 60 according to another embodiment of the invention wherein each row contacts 601 are arranged in a transverse direction perpendicular to a vertical plane while the mating port 602 extends upwardly and obliquely. FIG. 38 shows a receptacle connector 61 according to another embodiment of the invention wherein each row contacts are arranged in a transverse direction and the tail sections 611 of the two row contacts commonly sandwich the printed circuit board 612. FIG. 39 shows a receptacle connector 62 according to another embodiment of the invention wherein each row contacts are arranged in a transverse direction and the tail sections 621 of the two row contacts are surface mounted upon an obliquely extending printed circuit board 622. FIG. 40 shows a receptacle connector 63 according to another embodiment of the invention wherein the mating tongue is made by a printed circuit board which can be an internal PCB 631 adapted to connect to the mother board 633 via other contacts 632.

Figure 41:
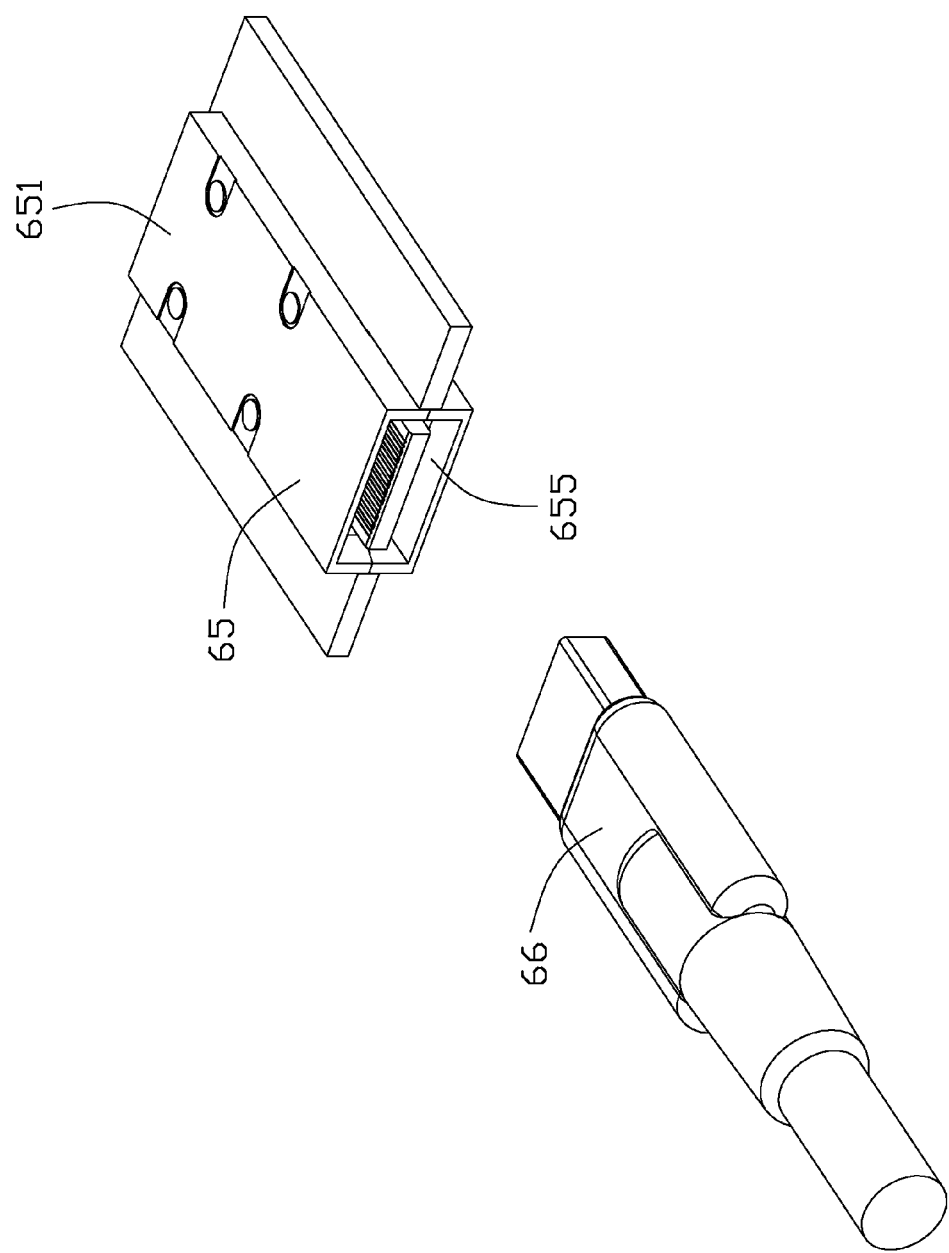
FIG. 41 is perspective view of the plug connector and the receptacle connector according to another embodiment of the instant invention.
Figure 42:
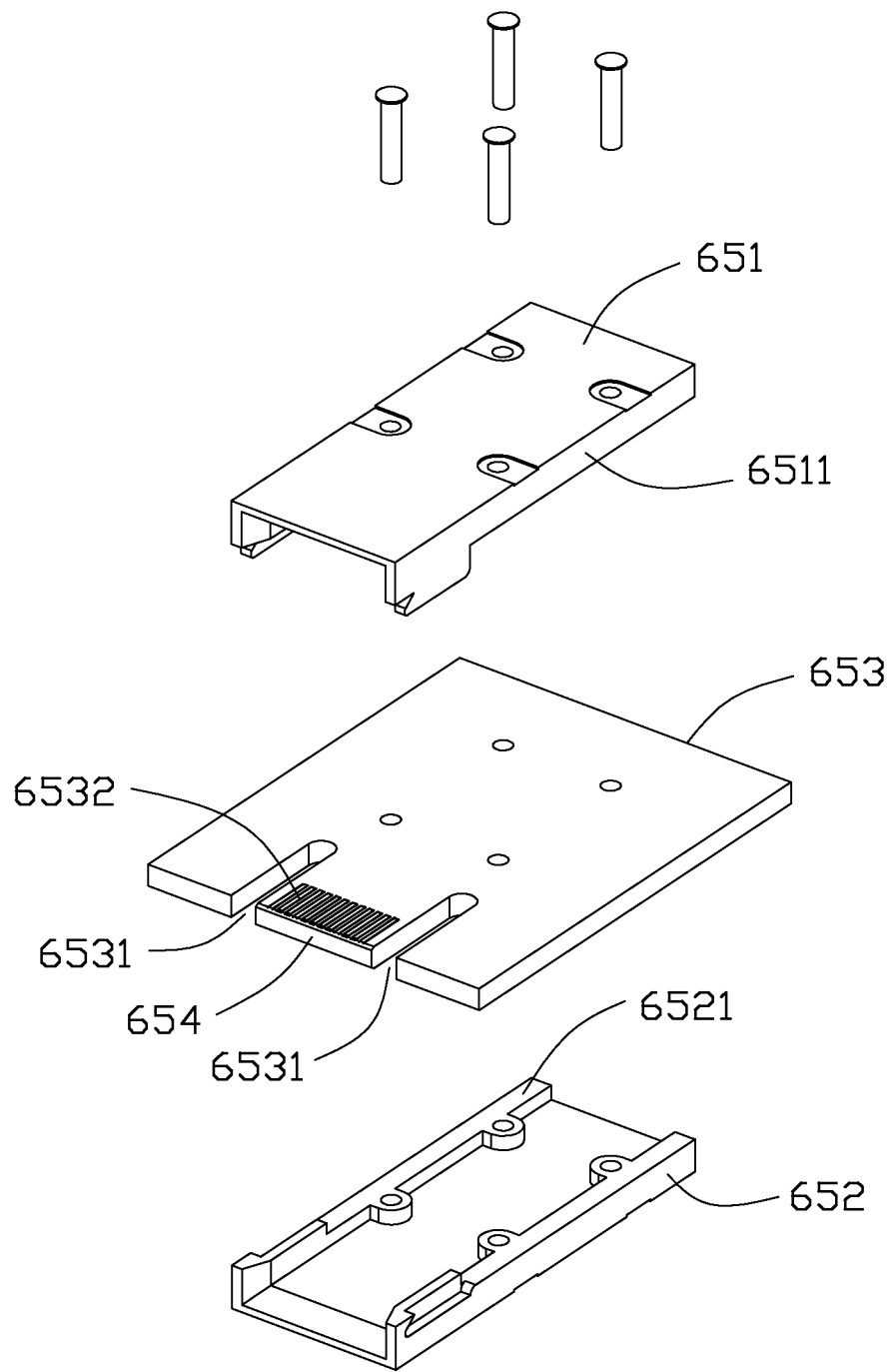
FIG. 42 is an exploded perspective view of the receptacle connector of FIG. 23 and the according plug connector.
Figure 43:
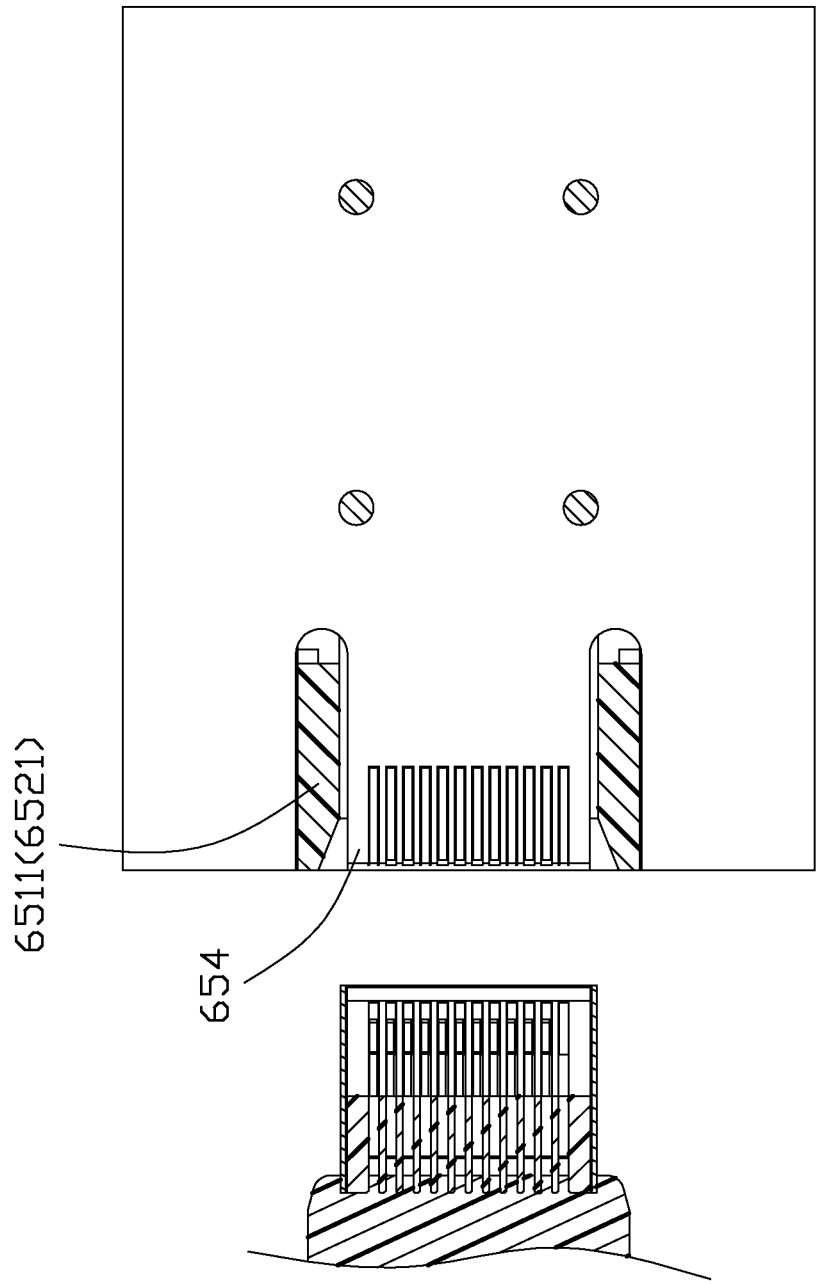
FIG. 43 is an illustration cross-sectional view of the plug connector and the receptacle connector of FIG. 41 in a ready-to-mate condition.
Figure 44:
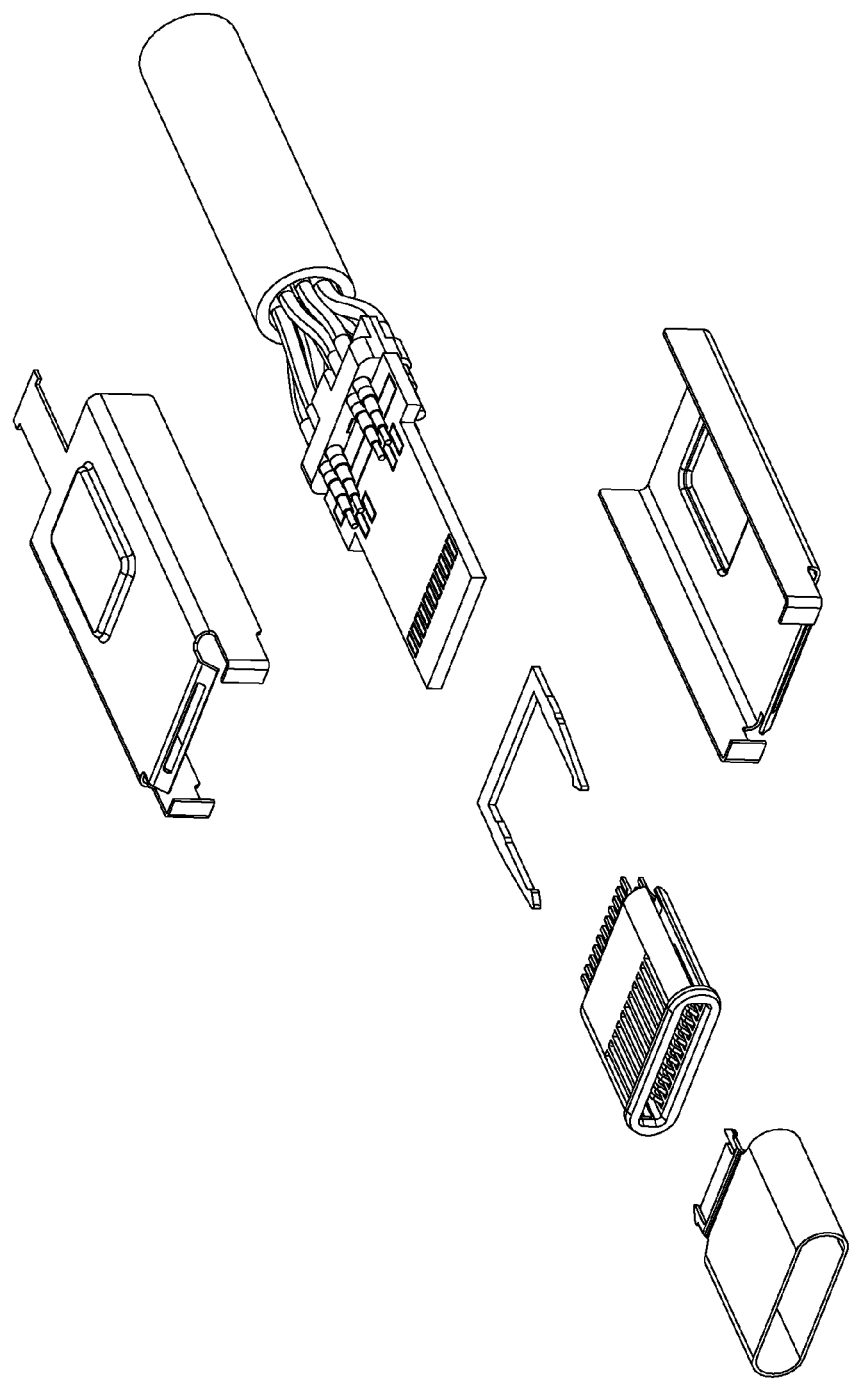
FIG. 44 is an exploded perspective view of the plug connector shown in the parent application Ser. No. 14/542,550.
Figure 45:
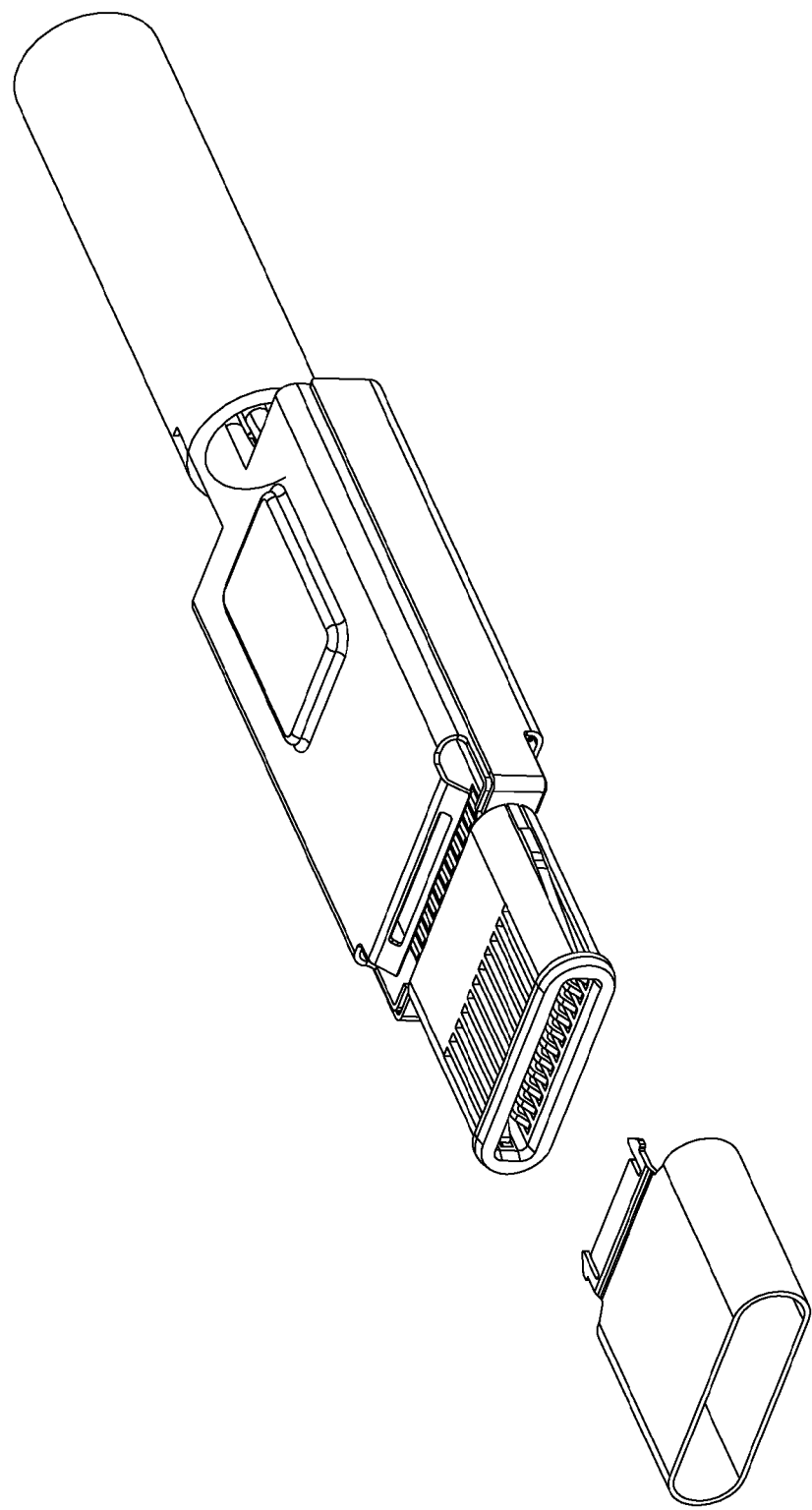
FIG. 45 is a partially assembled perspective view of the plug connector of FIG. 44.
Figure 46:
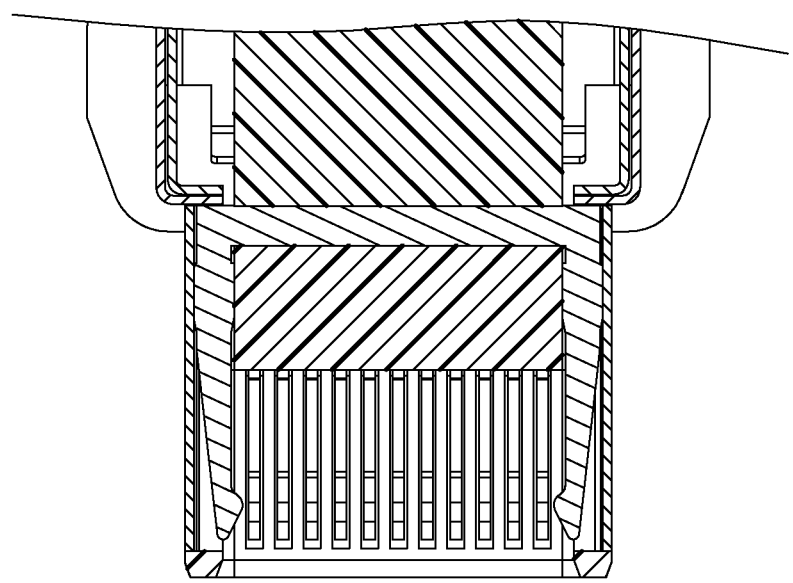
FIG. 46 is an enlarged cross-section illustrating view of the assembled plug connector of FIG. 44.
Figure 47:
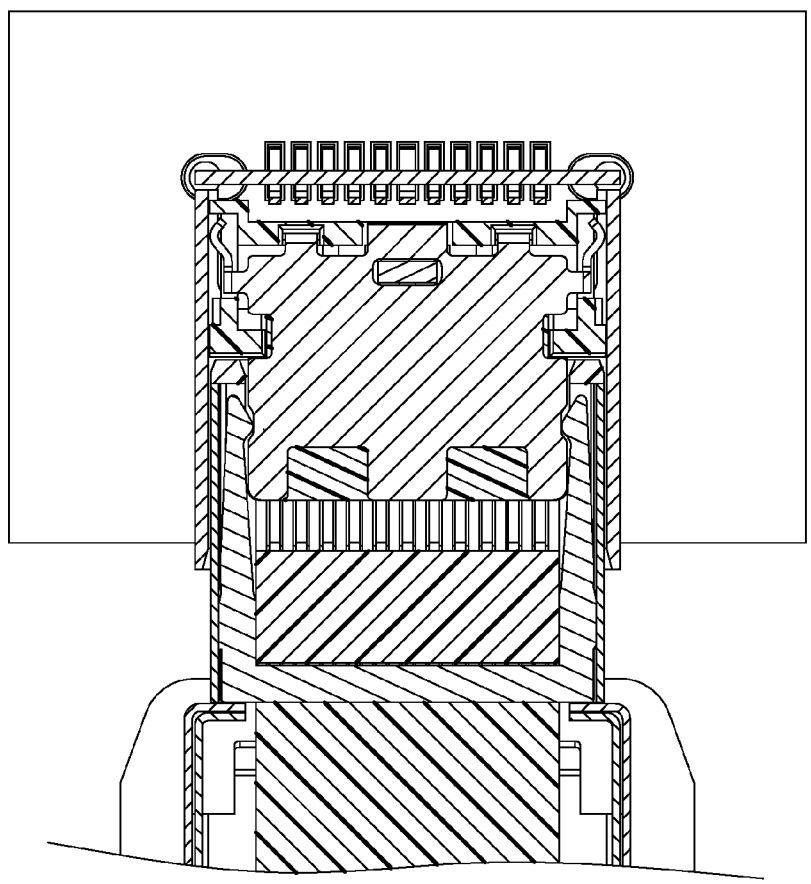
FIG. 47 is a cross-section horizontal illustrating view of the plug connector of FIG. 46 and the corresponding receptacle connector to show engagement between the shielding plate and the latch clip when mating.
Figure 49:
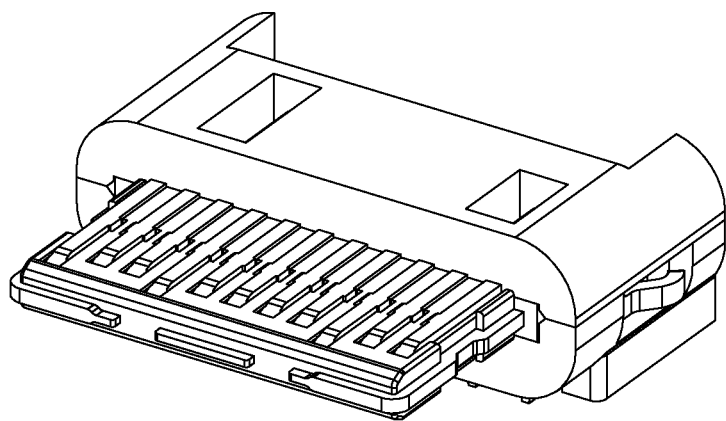
FIG. 49 is the assembled terminal module assembly of the receptacle connector of FIG. 48.
Figure 50:
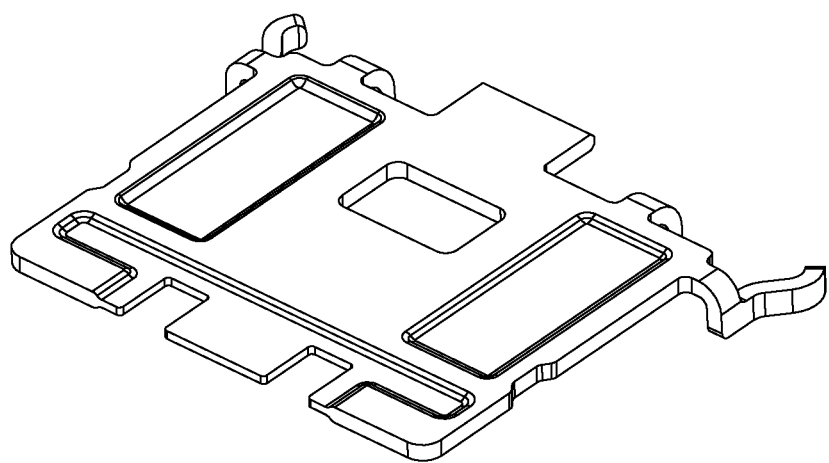
FIG. 50 is a perspective view of the shielding plate in FIG. 49.
Figure 51:
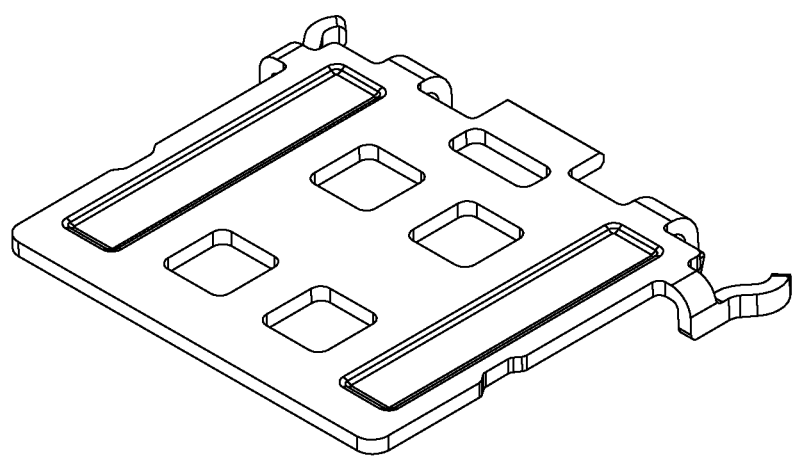
FIG. 51 is a perspective view of another embodiment of the shielding plate for use with the corresponding receptacle connector of FIG. 48.
Figure 52:
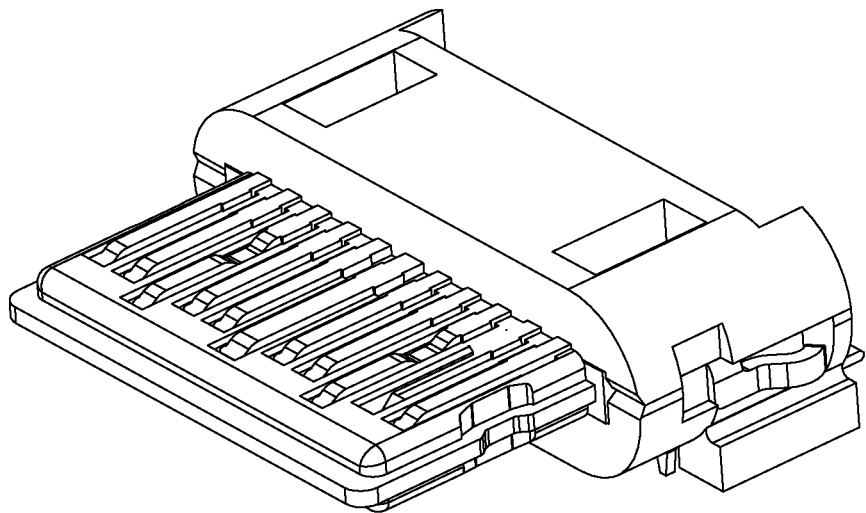
FIG. 52 is a perspective view of the assembled terminal module assembly for use with the shielding plate of 51.

Referring to FIGS. 41-43, the receptacle connector 65 includes a housing essentially composed of a straddle mounting upper housing 651 and a straddle mounting lower housing 652 commonly sandwiching therebetween a printed circuit board 653 which is essentially a mother board of a mobile device. A front edge region of the printed circuit board 653 defines a pair of cutouts/slots 6531 to form a mating tongue 654 therebetween. A plurality of circuit pads 6532 are formed on a front region of the mating tongue 650. The upper housing 651 and the lower housing 652 include two side walls 6511, 6521 extending into the corresponding slots 6531 to commonly form a mating port 655 in which the mating tongue 654 forwardly extends. The mating port of the plug connector 66 is mated with the mating port 655 wherein the center slot of the plug connector 66 receives the mating tongue 654, and the two opposite side wall of the housing of the plug connector 66 is received in the corresponding slots 6531, respectively. Understandably, the contact assignment of all embodiments above also allows the plug connector to be upside down mated with the receptacle connector in a flippable way. FIGS. 44-53 show the earlier embodiments disclosed in the parent applications and related to the provisional applications.

However, the disclosure is illustrative only, changes may be made in detail, especially in matter of shape, size, and arrangement of parts within the principles of the invention.

What is claimed is:

1. A receptacle connector assembly adapted for mating with a plug connector, comprising:
    an insulative housing defining base with a mating tongue forwardly extending therefrom;
    a plurality of contacts disposed in the housing with contacting sections exposed upon the mating tongue and categorized with signal contacts, power contacts and grounding contacts;
    a metallic shell enclosing the housing to define a mating cavity in which mating tongue is disposed; and
    a metallic shielding plate disposed within a middle level of the mating tongue and occupying most portions of said mating tongue; wherein
    the shielding plates defines a pair of lateral edge sections each configured to be adapted to be locked with a latch of the plug connector.

2. The receptacle connector assembly as claimed in claim 1, wherein a leg of the shielding plate and a tail of a grounding contact share a same conductive grounding region of a printed circuit board on which the connector is mounted.

3. The receptacle connector assembly as claimed in claim 2, wherein the leg of the shielding plate and the tail of the grounding contact extend vertically as a through type, and the same conductive grounding region is of an oval shaped via into which both said leg of the shielding plate and the tail of said one grounding contact extends.

4. The receptacle connector assembly as claimed in claim 1, wherein said laterally edge sections are immoveable and un-deflectable in a transverse direction and the latch of the plug connector is deflectable in said transverse direction.

5. The receptacle connector assembly as claimed in claim 4, wherein the housing includes opposite upper and lower pieces commonly sandwiching a middle piece therebetween in a vertical direction perpendicular to said transverse direction, said upper piece and said lower piece are integrally associated with the corresponding contacts, respectively, and the shielding plate is embedded within the middle piece.

6. The receptacle connector assembly as claimed in claim 5, wherein the upper piece, the middle piece and the lower piece are configured to be assembled with one another only along said vertical direction.

7. The receptacle connector assembly as claimed in claim 4, wherein the housing forms a front face essentially flush with a front edge of the shell in a transverse direction for lateral protection the shell.

8. The receptacle connector assembly as claimed in claim 7, wherein the housing forms a receiving space behind the front face to receive another connector part which is spaced from the shell with a partition wall therebetween.

9. The receptacle connector assembly as claimed in claim 8, wherein said receiving space is located under the shell in a vertical direction perpendicular to said transverse direction with a forward opening and a downward opening to communicate with an exterior so as to allow another connector to be independently mate with another plug connector along a front-to-back direction perpendicular to both transverse direction and said vertical direction, and to be mounted, in the vertical direction, to a printed circuit board on which said housing is seated.

10. The receptacle connector assembly as claimed in claim 4, wherein a metallic bracket compliantly at least partially intimately covering the shell for supportably mounting the connector upon said printed circuit board.

11. The receptacle connector assembly as claimed in claim 4, wherein said contacts are mechanically and electrically connected to corresponding respective wires of a cable, and the shell is retained within a case with a front section thereof exposed outside of the case.

12. The receptacle connector assembly as claimed in claim 4, wherein the contacts are mounted to a printed circuit board on which the housing is generally seated, and the mating tongue extends in a vertical plane with regard to the printed circuit board in a vertical direction perpendicular to said transverse direction.

13. The receptacle connector assembly as claimed in claim 4, wherein the contacts are mounted to a printed circuit board on which the housing is generally seated, and the mating tongue extends along a plane which is oblique to another plane defined by extension of said printed circuit board.

14. The receptacle connector assembly as claimed in claim 4, further including a spacer to align tails of the contacts with regard to a mounting region of a printed circuit board on which the housing is generally seated.

15. A plug connector for use with a complementary receptacle connector, comprising:

an insulative housing defining a receiving cavity and enclosed in the metallic shell;

a plurality of contacts disposed in the housing and by two sides of the receiving cavity in the vertical direction, and categorized with signal contacts, power contacts and grounding contacts;

a metallic latch retained in the housing with a pair of locking heads extending into two opposite lateral sides of the receiving cavity for latchable engagement with a shielding plate which is disposed within a mating tongue of the receptacle connector during mating.

16. The plug connector assembly as claimed in claim 15, wherein tail sections of the contacts are directly mounted to an internal printed circuit board, the metallic latch defines a rear connection structure to electrically and mechanically connect to a grounding pad of the paddle card.

17. The plug connector assembly as claimed in claim 16, wherein the rear connection structure of the latch and a tail of an outermost grounding contact share a same conductive grounding region on the paddle card.

18. The plug connector assembly as claimed in claim 15, further including a wire organizer to regulate a plurality of wires of a cable to electrically connect to the corresponding contacts, respectively.

19. The plug connector assembly as claimed in claim 18, further including a paddle card positioned between the contacts and the wires in a front-to-back direction, and mechanically and electrically connected to said contacts and said wires on opposite front and rear regions, respectively.

20. The plug connector assembly as claimed in claim 15, further including an insulative spacer to regulate tails of the contacts, and behind the latch a front-to-back direction.

* * * * *